(12) United States Patent
Fernandez et al.

(10) Patent No.: US 12,188,731 B2
(45) Date of Patent: Jan. 7, 2025

(54) SYSTEMS AND METHODS FOR THERMAL MANAGEMENT USING MATRIX COLDPLATES

(71) Applicant: AcLeap Power Inc., Taipei (TW)

(72) Inventors: Pedro Angel Fernandez, Plano, TX (US); Evan Cosentino, Richardson, TX (US)

(73) Assignee: AcLeap Power Inc., Taipei (TW)

( * ) Notice: Subject to any disclaimer, the term of this patent is extended or adjusted under 35 U.S.C. 154(b) by 724 days.

(21) Appl. No.: 17/031,963

(22) Filed: Sep. 25, 2020

(65) Prior Publication Data

US 2022/0099389 A1   Mar. 31, 2022

(51) Int. Cl.
*F28F 13/06* (2006.01)

(52) U.S. Cl.
CPC .................... *F28F 13/06* (2013.01)

(58) Field of Classification Search
CPC .......... F28F 13/06; F28F 7/02; G05D 23/025; G05D 23/023; H05K 7/20254
See application file for complete search history.

(56) References Cited

U.S. PATENT DOCUMENTS

| | | | | |
|---|---|---|---|---|
| 1,929,824 A * | 10/1933 | Polley | ................... | B30B 15/064 29/520 |
| 2,539,669 A * | 1/1951 | Newcomer | ........... | F28F 9/0212 165/286 |
| 4,884,168 A * | 11/1989 | August | .............. | H05K 7/20254 174/15.1 |
| 6,032,726 A | 3/2000 | Wright et al. | | |
| 6,101,715 A * | 8/2000 | Fuesser | .................. | H01C 1/082 257/E23.098 |
| 6,457,514 B1 * | 10/2002 | Fumi | ..................... | H01L 23/473 257/E23.098 |
| 6,935,412 B2 * | 8/2005 | Mueller | ................ | H01L 23/473 174/15.1 |
| 6,988,535 B2 * | 1/2006 | Upadhya | ................... | F28F 3/12 174/15.1 |
| 7,178,586 B2 | 2/2007 | Goldman et al. | | |

(Continued)

FOREIGN PATENT DOCUMENTS

| | | |
|---|---|---|
| CA | 2504757 A1 | 10/2006 |
| DE | 102017109890 A1 | 11/2018 |

(Continued)

OTHER PUBLICATIONS

European Search Report for EP21198829 dtd Feb. 11, 2022, 6 pgs.

*Primary Examiner* — Tho V Duong
(74) *Attorney, Agent, or Firm* — McCarter & English, LLP

(57) ABSTRACT

Systems and methods for thermal management using matrix coldplates are disclosed. One illustrative method may comprise directing a flow of coolant through a coldplate comprising a plurality of parallel passages by selectively connecting portions of the parallel passages to one another to create one or more regions of parallel flow, serial flow, or blocked flow in the coldplate. Selectively connecting portions of the parallel passages may comprise machining a plurality of transverse passages into the cold plate such that each of the transverse passages intersects at least some of the parallel passages. Valves may be installed to interact between the parallel and transverse passages to create and modify the different flow regions.

16 Claims, 13 Drawing Sheets

(56) References Cited

U.S. PATENT DOCUMENTS

| | | | |
|---|---|---|---|
| 7,204,303 B2 | 4/2007 | Thomas et al. | |
| 7,213,638 B2 * | 5/2007 | Seiler | F28D 1/0443 |
| | | | 29/890.03 |
| 7,261,144 B2 * | 8/2007 | Thome | F28D 15/06 |
| | | | 165/104.23 |
| 2009/0200007 A1 * | 8/2009 | Foy | F28F 27/02 |
| | | | 165/104.33 |
| 2012/0132413 A1 | 5/2012 | Cheadle et al. | |
| 2014/0251579 A1 | 9/2014 | Sloss | |
| 2015/0114030 A1 * | 4/2015 | Park | F28D 1/05358 |
| | | | 62/507 |

FOREIGN PATENT DOCUMENTS

| | | |
|---|---|---|
| WO | 03098026 A1 | 11/2003 |
| WO | 2005040709 A1 | 5/2005 |

\* cited by examiner

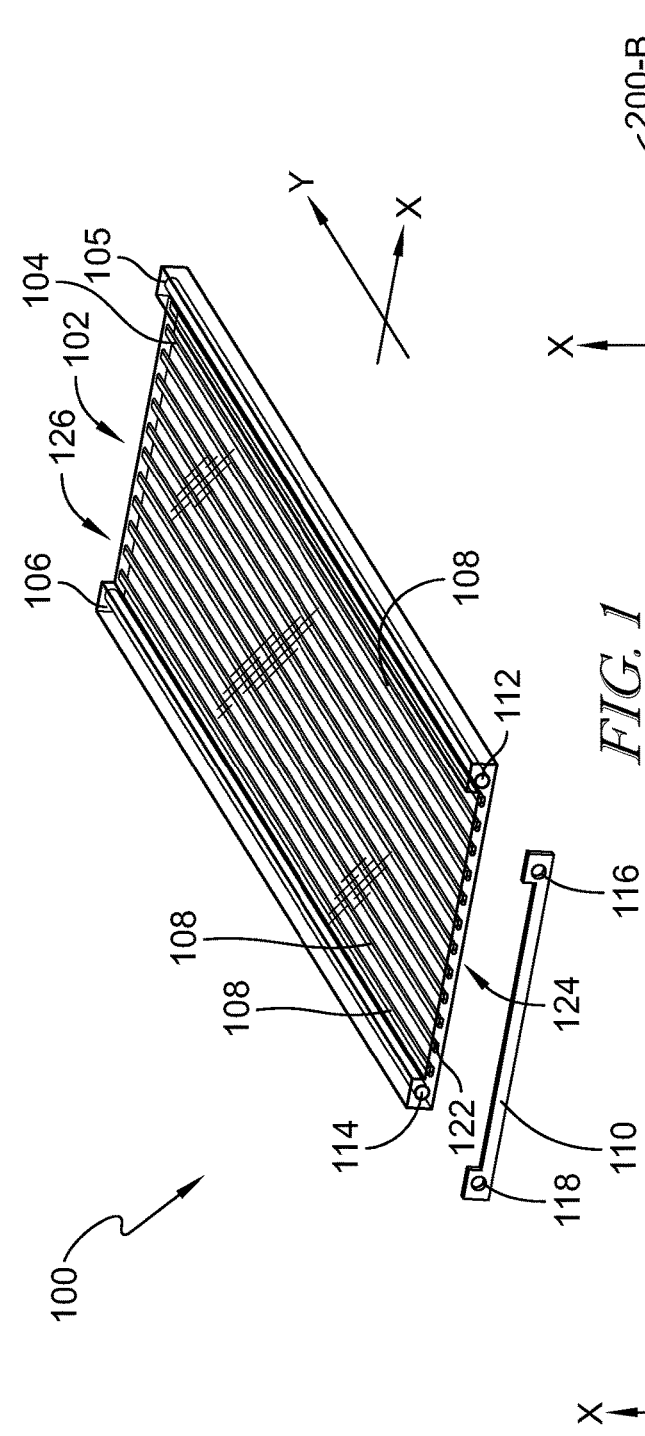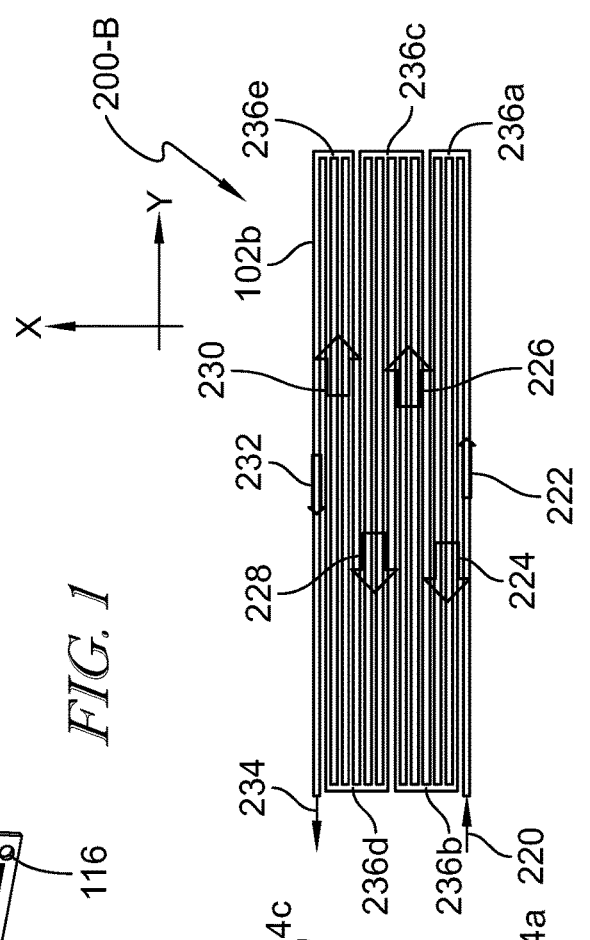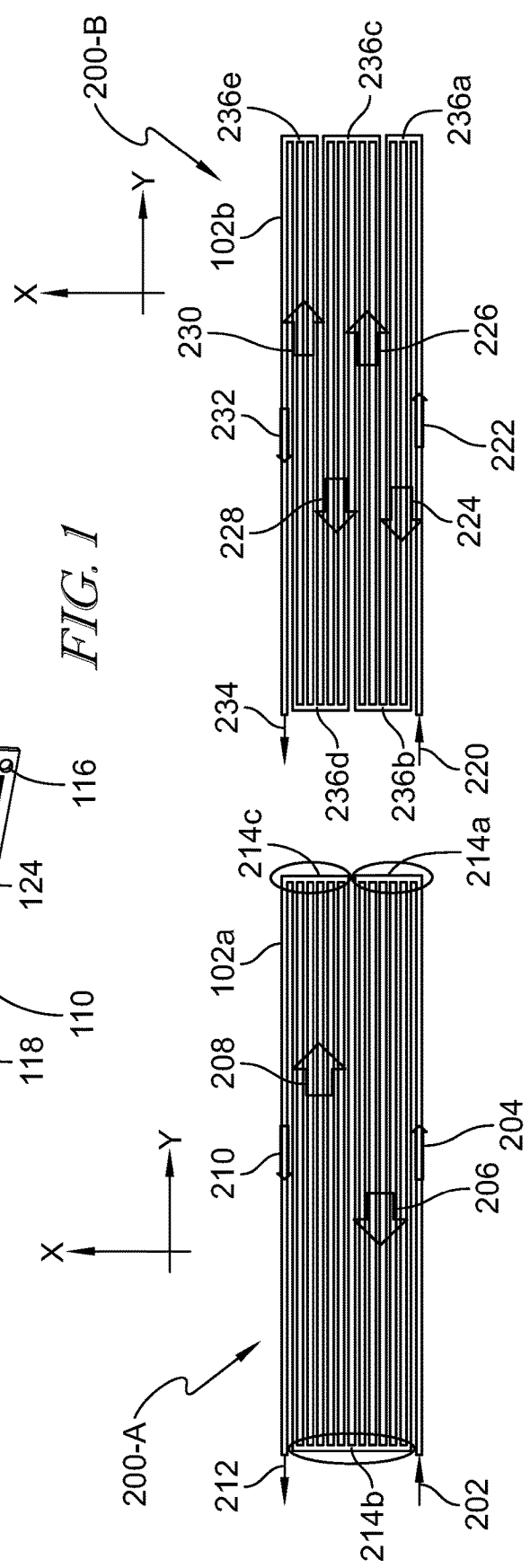

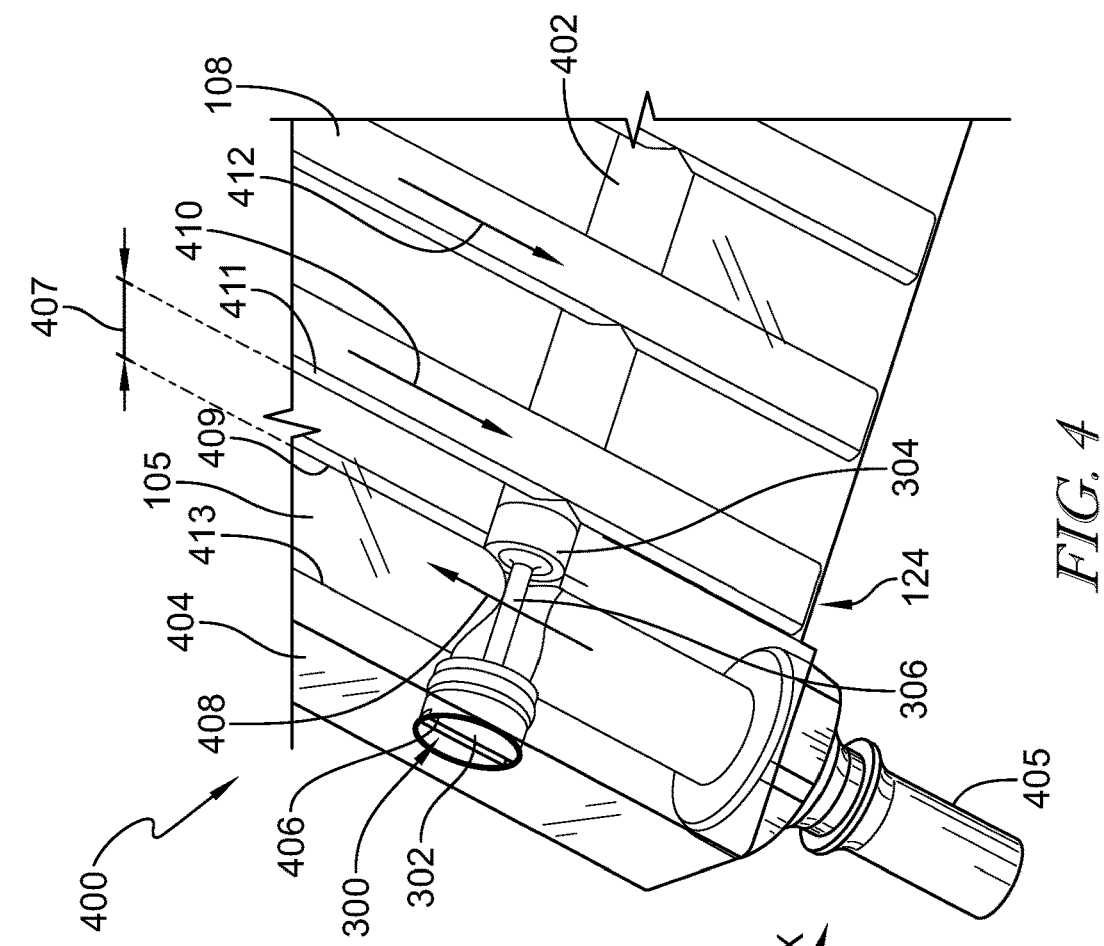
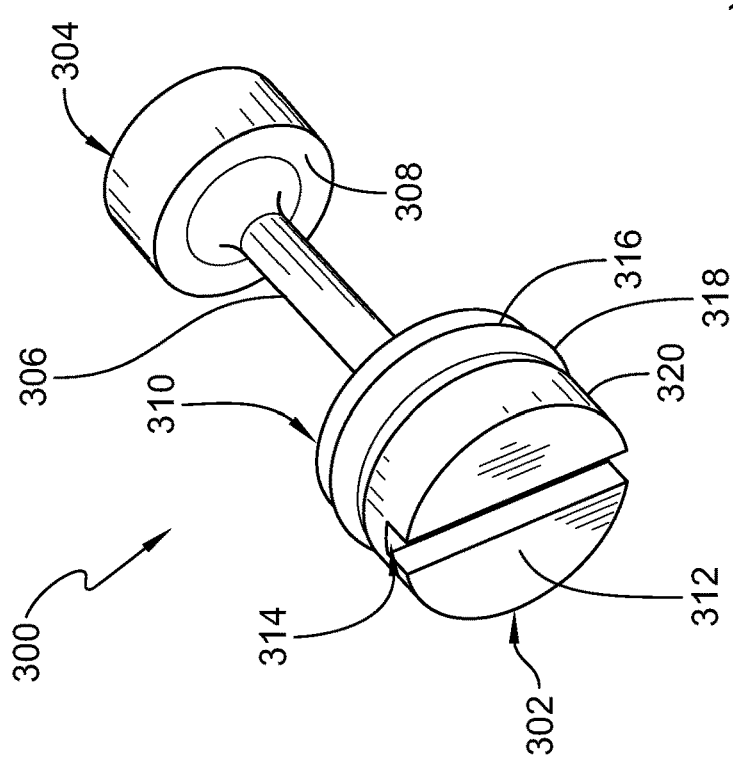
FIG. 4
FIG. 3

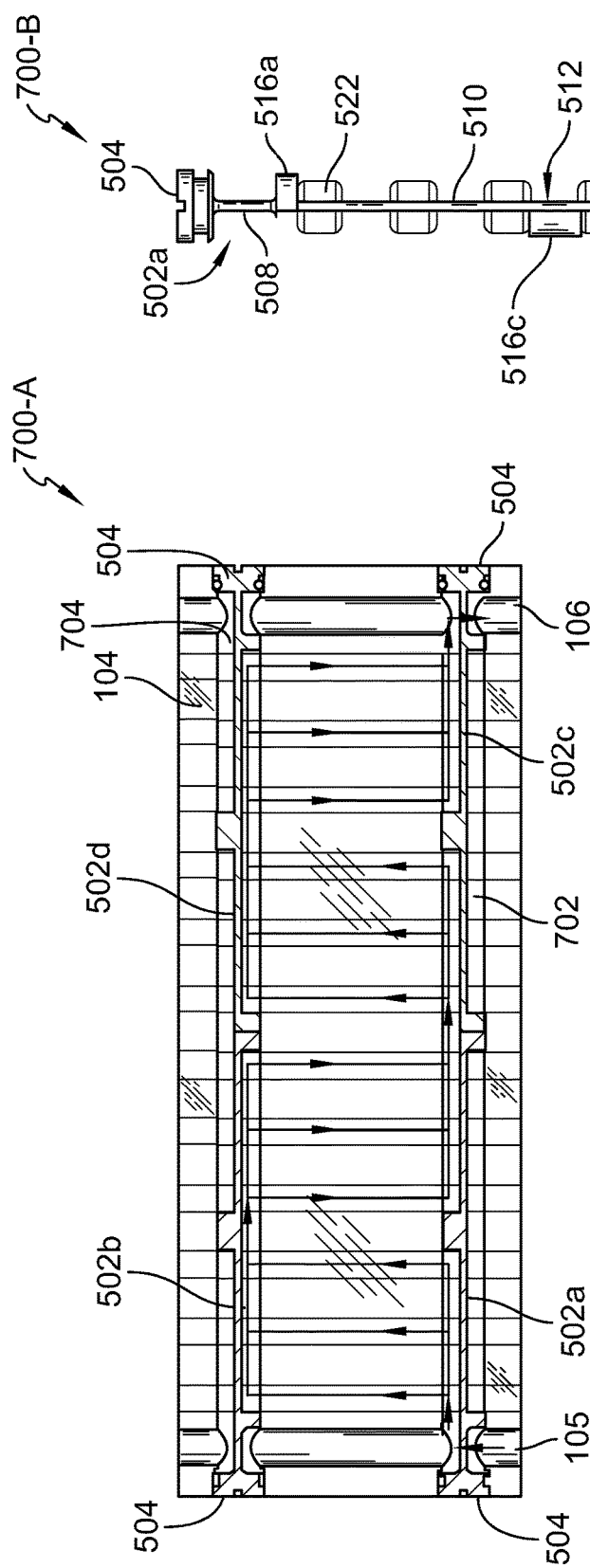
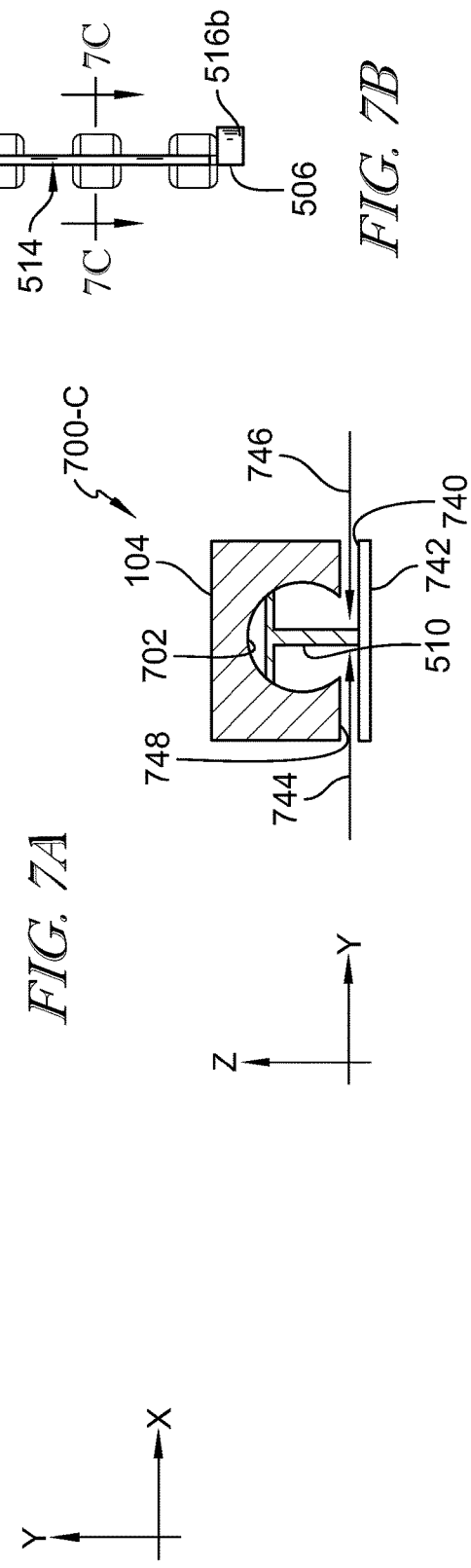
FIG. 7A
FIG. 7B
FIG. 7C

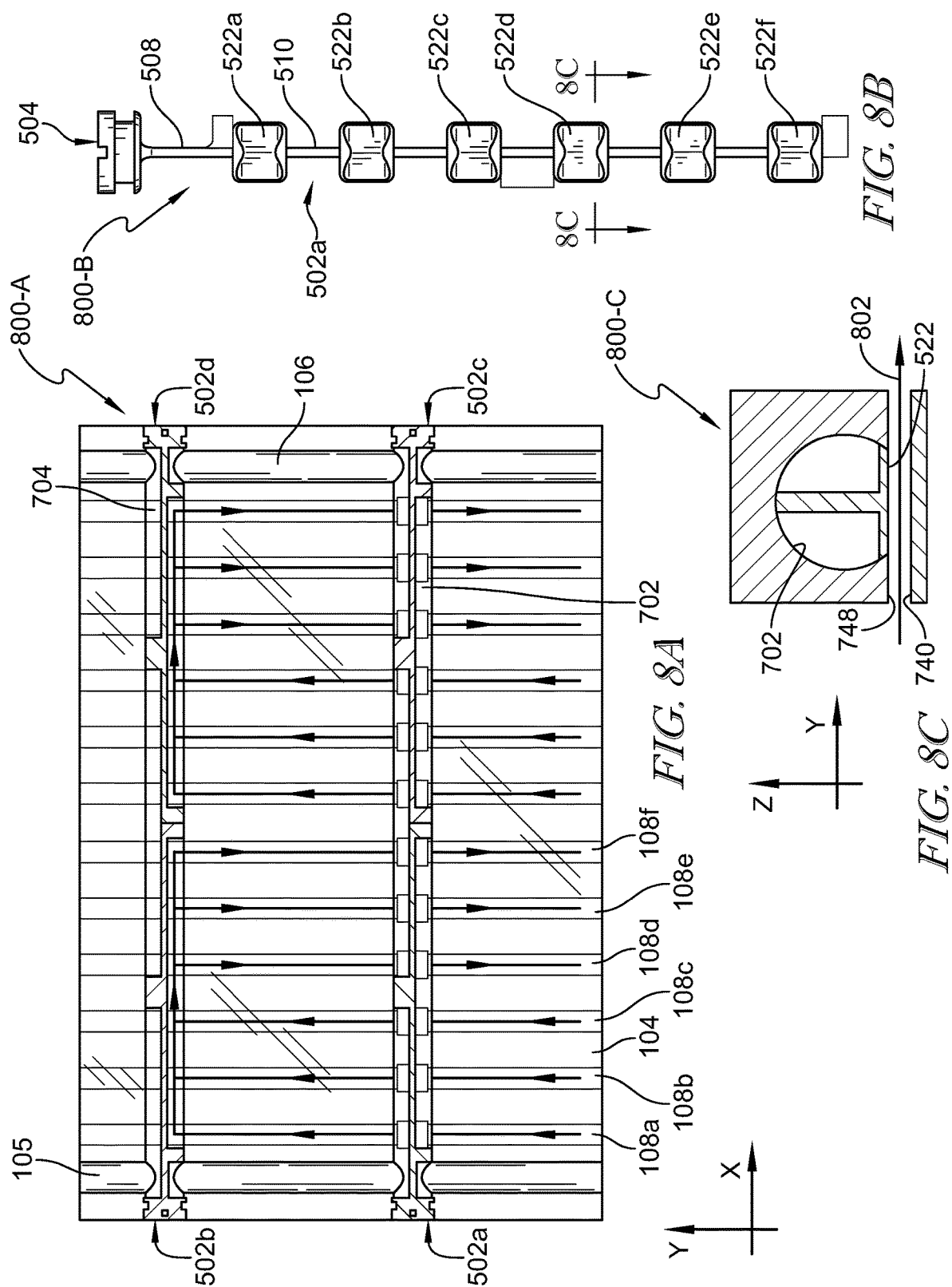

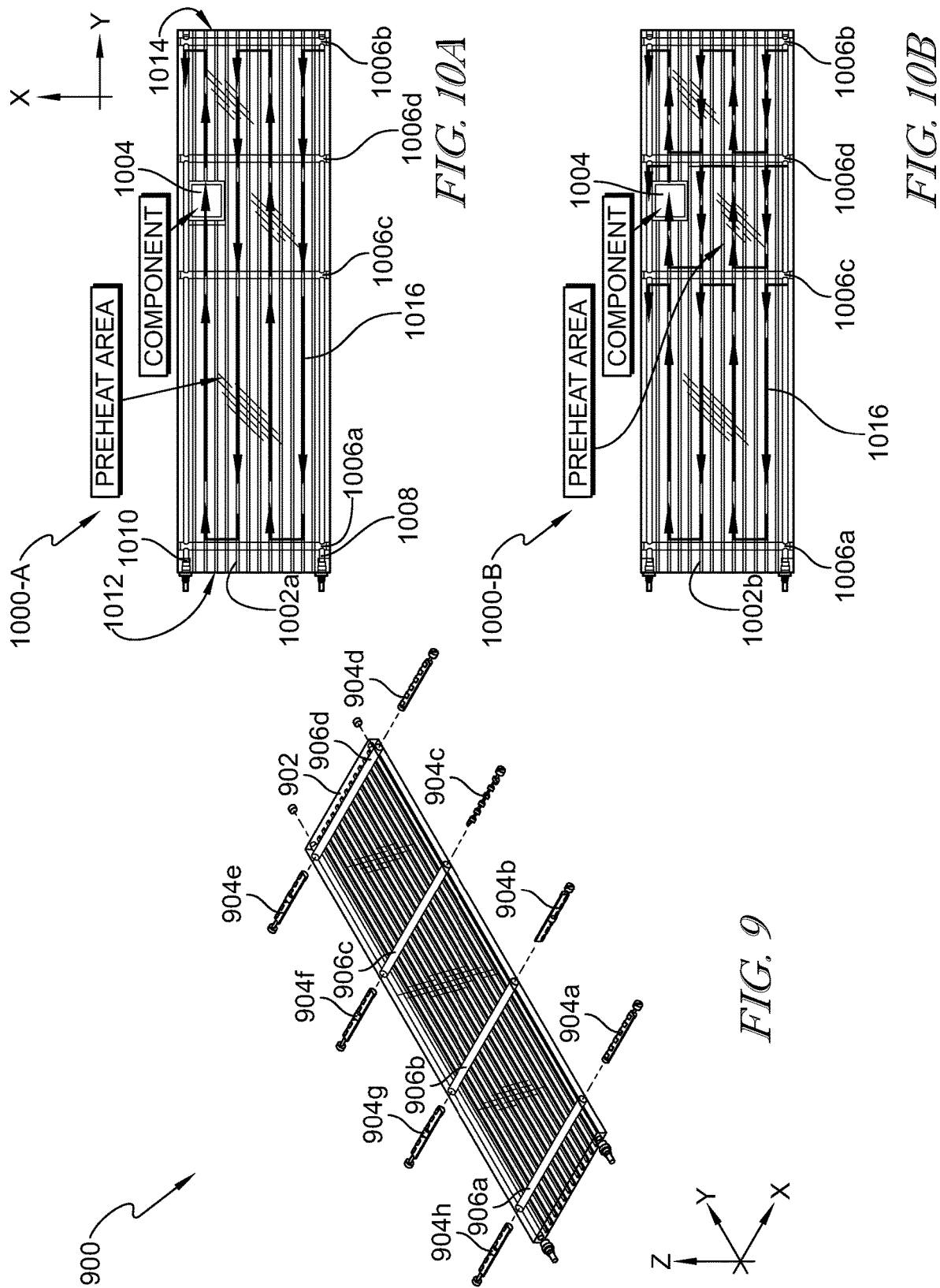

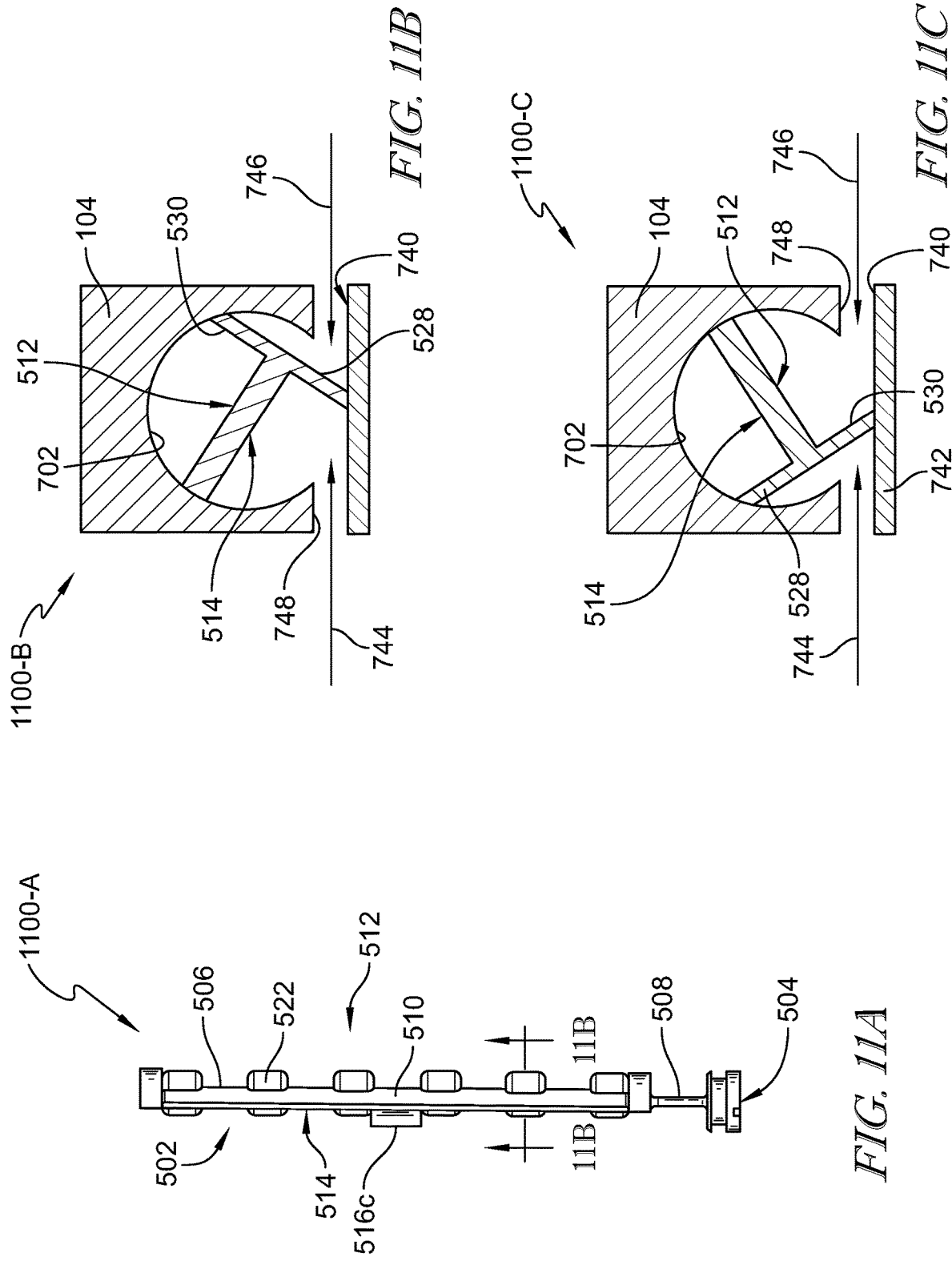

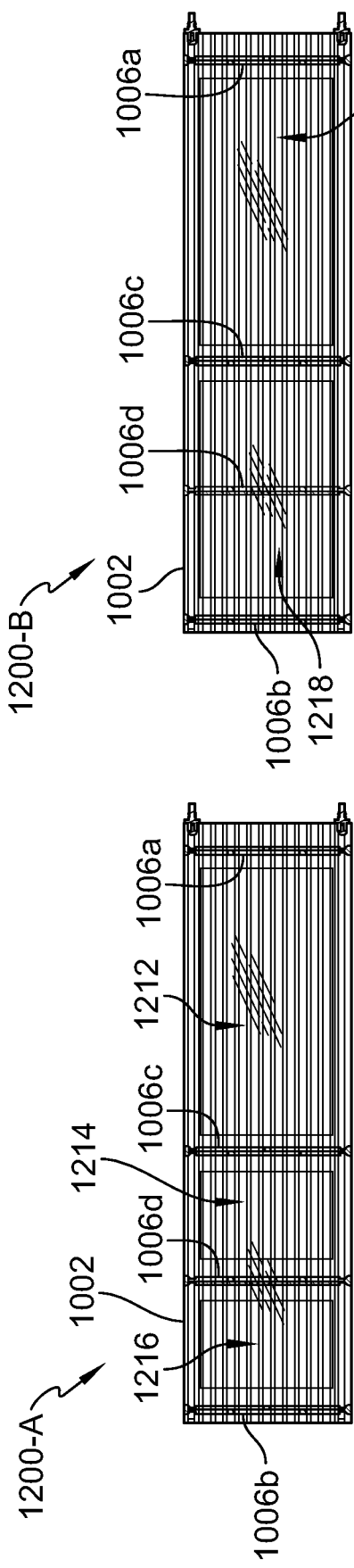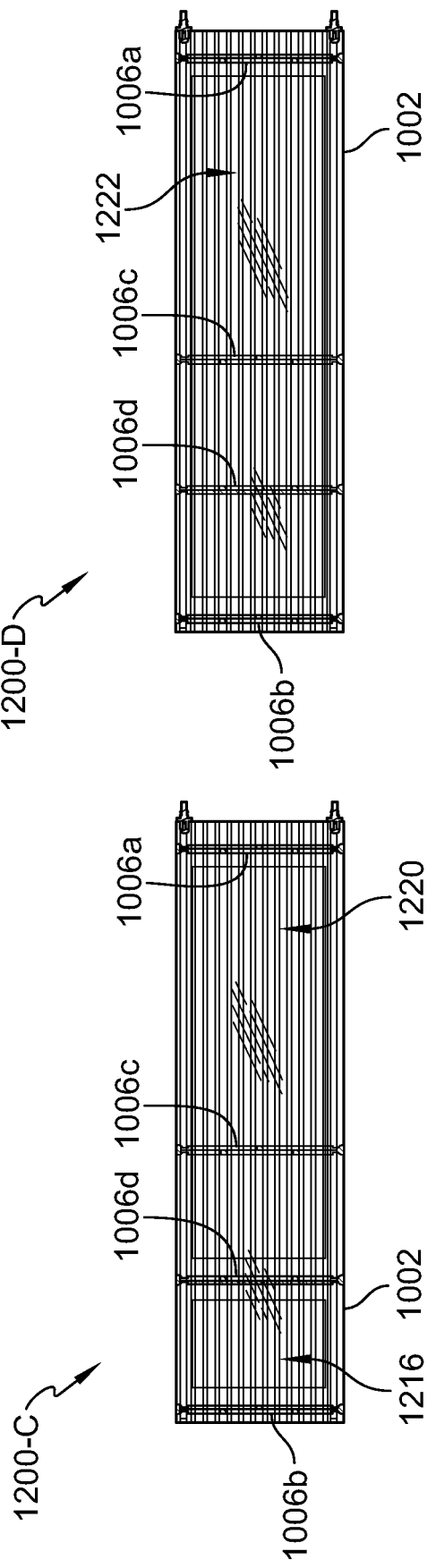
FIG. 12A
FIG. 12B
FIG. 12C
FIG. 12D

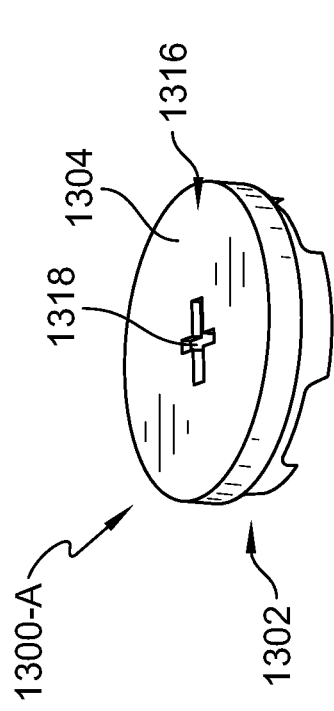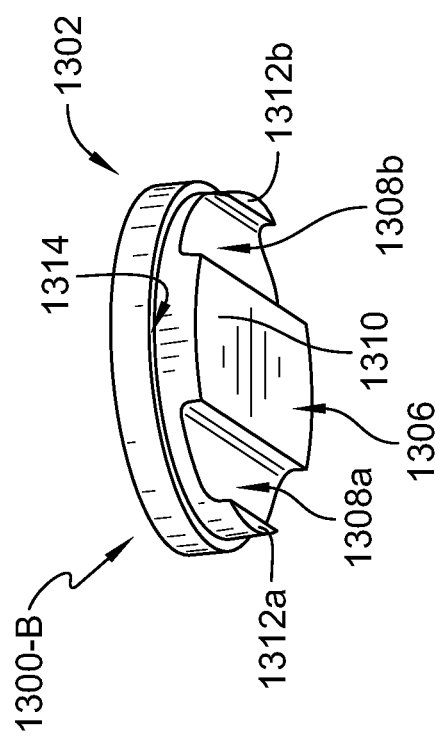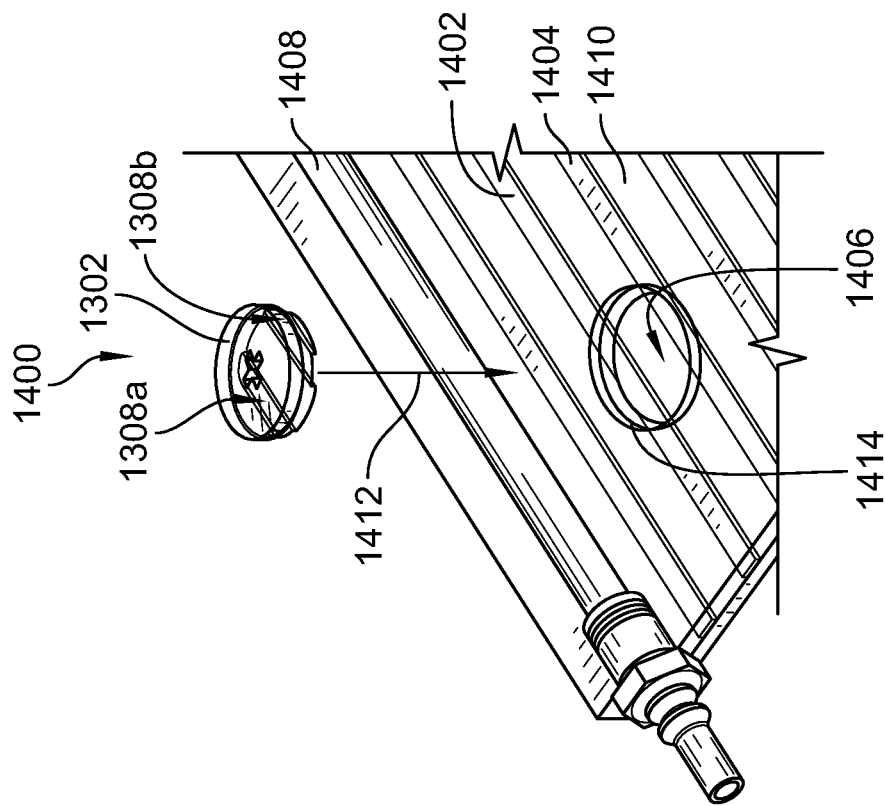

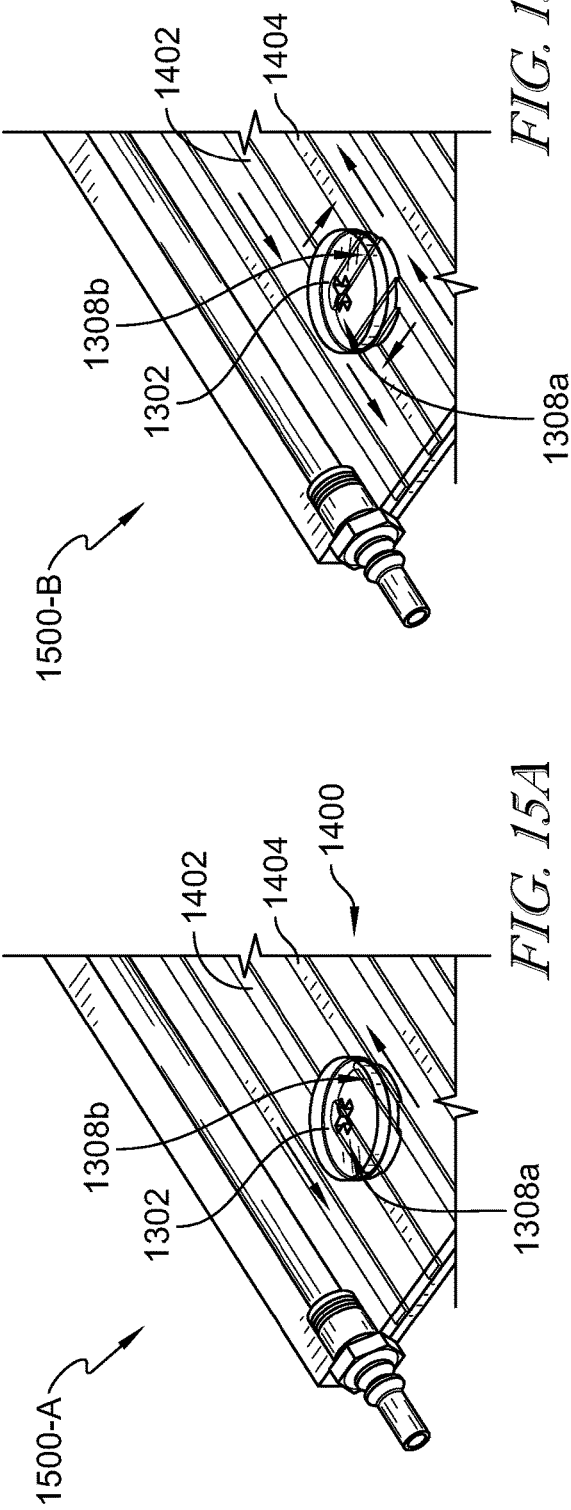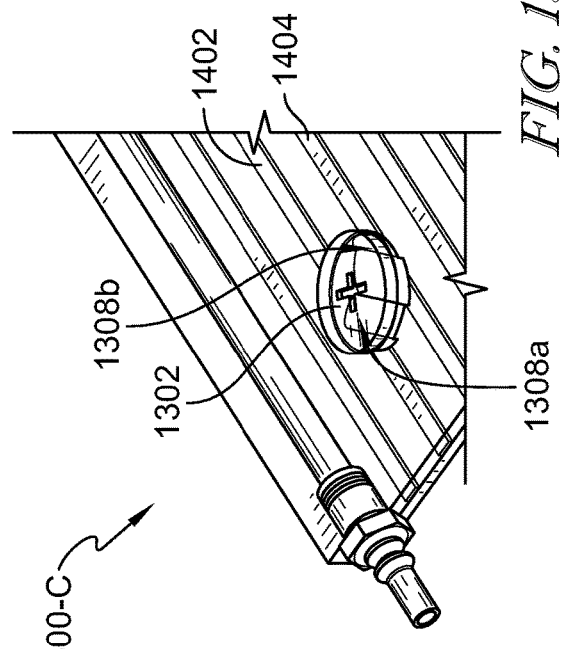

SYSTEMS AND METHODS FOR THERMAL MANAGEMENT USING MATRIX COLDPLATES

TECHNICAL FIELD

The present disclosure relates to systems and methods for thermal management using matrix coldplates.

BACKGROUND

Electrical and mechanical components generate heat during operation. Excess heat may cause components to cease operating or to operate incorrectly. Accordingly, having an efficient heat transfer strategy is an important factor in ensuring component reliability and effectiveness.

A typical coldplate may comprise copper tubing formed by way of computer numerical control (CNC). The tubing may be pressed or flattened into a base plate to closely match a unique shape of the base plate. Further, the tubing may be epoxied, or otherwise firmly mated to the base plate. The tubing may then be further re-machined. Adapters may be brazed onto copper tube for customer's fittings.

The base plate may comprise an aluminum plate machined to define a plurality of copper tube passages, mounting holes, as well as, machining-removed sections to reduce overall weight. Accordingly, a given coldplate may be shaped into a particular configuration to fit a specific application. Once formed, however, the coldplate design may be difficult to adapt for heat transfer applications different from the one for which it was originally designed.

SUMMARY

According to one aspect of the present disclosure, a method may comprise directing a flow of coolant through a coldplate comprising a plurality of parallel passages by selectively connecting portions of the parallel passages to one another to create one or more regions of parallel flow, serial flow, or blocked flow in the coldplate.

In some embodiments, each of the plurality of passages may open to an end surface of the coldplate. Selectively connecting portions of the parallel passages may comprise applying a seal plate to the end of the coldplate that connects at least some of the parallel passages to one another.

In some embodiments, applying the seal plate to the end of the coldplate may connect a first subset of the parallel passages to one another and connect a second subset of the parallel passages to one another.

In some embodiments, selectively connecting portions of the parallel passages may comprise machining a plurality of transverse passages into the cold plate such that each of the transverse passages intersects at least some of the parallel passages.

In some embodiments, the method may further comprise extruding the coldplate to form the plurality of parallel passages, prior to machining the plurality of transverse passages.

In some embodiments, at least one of the plurality transverse passages may intersect only a subset of the parallel passages.

In some embodiments, selectively connecting portions of the parallel passages may comprise positioning a valve at a junction formed where one of the transverse passages intersects one of the parallel passages.

In some embodiments, positioning the valve at the junction may comprise positioning the valve in one of: (i) a first position in which the valve redirects the flow of coolant from the parallel passage to the transverse passage, (ii) a second position in which the valve permits the flow of coolant in the parallel passage and blocks the flow of coolant in the transverse passage, and (iii) a third position in which the valve blocks the flow of coolant in both the parallel passage and the transverse passage.

In some embodiments, the method may further comprise moving the valve from one of the first, second, and third positions to another of the first, second, and third positions to change the flow of coolant through the coldplate.

In some embodiments, the method may further comprise adjusting the position of the valve to change the flow of coolant through the coldplate.

In some embodiments, the position of the valve may be adjusted automatically in response to the thermal conditions of the coldplate.

According to another aspect of the present disclosure, a coldplate assembly may comprise a base plate defining an inlet passage, an outlet passage, a first intermediate passage, a second intermediate passage, and a transverse passage. The first and second intermediate passages may each be disposed between the inlet passage and the outlet passage, and the transverse passage may be arranged to intersect the first intermediate passage to define a first junction and to intersect the second intermediate passage to define a second junction. The coldplate assembly may further comprise a valve comprising at least one protrusion. The valve may be moveable within the transverse passage between at least two of: (i) a first position in which the at least one protrusion is disposed with respect to the first and second junctions to redirect a flow of coolant from the first intermediate passage to the second intermediate passage; (ii) a second position in which the at least one protrusion is disposed with respect to the first junction to direct the flow of coolant past the first junction along the first intermediate passage; and (iii) a third position in which the at least one protrusion is disposed with respect to the first junction to close off at least a section of the first intermediate passage to the flow of coolant.

In some embodiments, the valve may be moveable within the transverse passage between each of the first, second, and third positions.

In some embodiments, the valve may be a rotating valve that is rotatable within the transverse passage between the first, second, and third positions.

In some embodiments, the at least one protrusion of the valve may be disposed with respect to the second junction to direct the flow of coolant past the second junction along the second intermediate passage when the valve is in the second position.

In some embodiments, the at least one protrusion of the valve may be disposed with respect to the second junction to close off at least a section of the second intermediate passage to the flow of coolant when the valve is in the third position.

In some embodiments, the valve may comprise a first end portion and a second end portion coupled to the first end portion by a connecting rod disposed in one of the inlet passage and the outlet passage. The at least one protrusion may be disposed on the second end portion.

In some embodiments, the transverse passage may be a first transverse passage, the valve may be a first valve. The base plate may further define a second transverse passage spaced apart from the first transverse passage, the second transverse passage being arranged to intersect the first intermediate passage to define a third junction and to intersect the second intermediate passage to define a fourth junction. The coldplate assembly may further comprise a second valve that includes at least one protrusion. The second valve may be movable independently from the first valve. The second valve may be moveable within the second transverse passage between at least two of: (i) a first position in which the at least one protrusion is disposed with respect to the third and fourth junctions to redirect flow of coolant from the first intermediate passage to the second intermediate passage; (ii) a second position in which the at least one protrusion is disposed with respect to the third junction to direct flow of coolant past the third junction along the first intermediate passage; and (iii) a third position in which the at least one protrusion is disposed with respect to the third junction to close off at least a section of the first intermediate passage to the flow of coolant.

In some embodiments, the valve may be a first valve, and the base plate may further define a third intermediate passage and a fourth intermediate passage. The transverse passage may be arranged to also intersect the third intermediate passage to define a third junction and to intersect the fourth intermediate passage to define a fourth junction. The coldplate assembly may further comprise a second valve that includes at least one protrusion. The second valve may abuts the first valve when the first and second valves are disposed in the transverse passage. The second valve may be movable independently from the first valve. The second valve may be moveable within the transverse passage between at least two of: (i) a first position in which the at least one protrusion is disposed with respect to the third and fourth junctions to redirect flow of coolant from the third intermediate passage to the fourth intermediate passage; (ii) a second position in which the at least one protrusion is disposed with respect to the third junction to direct flow of coolant past the third junction along the third intermediate passage; and (iii) a third position in which the at least one protrusion is disposed with respect to the third junction to close off at least a section of the third intermediate passage to the flow of coolant.

In some embodiments, the inlet passage and the outlet passage may extend along opposite sides of the base plate. The first intermediate passage and the second intermediate passage may extend parallel to the inlet and outlet passages. The transverse passage may be disposed perpendicular to the inlet, outlet, and intermediate passages.

According to still another aspect of the present disclosure, a coldplate assembly may comprise an extruded base plate defining a plurality of extruded passages. The plurality of extruded passages may comprise an inlet passage configured to deliver coolant to the base plate, an outlet passage configured to expel coolant from the base plate, and at least two intermediate passages positioned between the inlet passage and the outlet passage. A transverse passage machined in the extruded base plate may intersect the inlet passage, the at least two intermediate passages, and the outlet passage to connect and transfer coolant between the inlet passage, the at least two intermediate passages, and the outlet passage.

In some embodiments, the transverse passage may be a first milled transverse passage, and the base plate may further include a second milled transverse passage. Each of the first and second milled transverse passages may be arranged to intersect the inlet passage, the at least two intermediate passages, and the outlet passage. The first and second milled transverse passages may be disposed about opposite ends of the base plate.

In some embodiments, the coldplate assembly may further comprise a first valve disposed in the first milled transverse passage and a second valve disposed in the second milled transverse passage.

In some embodiments, each of the first and second valves may be movable within the corresponding milled transverse passage between at least two of: (i) a first position in which at least one protrusion of the valve is arranged to redirect a flow of coolant between the at least two intermediate passages, (ii) a second position in which the at least one protrusion is arranged to direct parallel flows of coolant past the valve along the at least two intermediate passages, and (iii) a third position in which the at least one protrusion is arranged to close off at least a section of each of the at least two intermediate passages to the flow of coolant.

In some embodiments, each of the at least two intermediate passages may be shaped such that a horizontal cross-sectional dimension of the intermediate passage is greater than a vertical cross-sectional dimension of the intermediate passage.

In some embodiments, the coldplate assembly may further comprise a first valve disposed at a first junction where the transverse passage intersects a first intermediate passage of the at least two intermediate passages, where the first junction defines a boundary between first and second sections of the transverse passage. The first valve may be movable within the first junction between at least two of: (i) a first position in which a protrusion of the first valve is arranged to redirect a flow of coolant between the first intermediate passage and the first section of the transverse passage, (ii) a second position in which the protrusion of the valve is arranged to redirect the flow of coolant between the first intermediate passage and the second section of the transverse passage, and (iii) a third position in which the protrusion is arranged to allow the flow of coolant between the first and second sections of the transverse passage.

In some embodiments, the first valve may be further configured to allow the flow of coolant between the first intermediate passage and either of the first and second sections of the transverse passage when the first valve is in the third position.

In some embodiments, the coldplate assembly may further comprise a second valve disposed at a second junction where the transverse passage intersects a second intermediate passage of the at least two intermediate passages, where the second junction defines a boundary between the second section and a third section of the transverse passage. The second valve may be movable within the second junction between at least two of: (i) a first position in which a protrusion of the second valve is arranged to redirect a flow of coolant between the second intermediate passage and the second section of the transverse passage, (ii) a second position in which the protrusion of the valve is arranged to redirect the flow of coolant between the second intermediate passage and the third section of the transverse passage, and (iii) a third position in which the protrusion is arranged to allow the flow of coolant between the second and third sections of the transverse passage.

In some embodiments, the coldplate assembly may further comprise a lock clip configured to engage a surface of the first valve to prevent movement of the first valve between the first, second, and third positions.

BRIEF DESCRIPTION OF THE DRAWINGS

The concepts described in the present disclosure are illustrated by way of example and not by way of limitation in the accompanying drawings. For simplicity and clarity of illustration, elements illustrated in the drawings are not necessarily drawn to scale. For example, the dimensions of some elements may be exaggerated relative to other elements for clarity. Further, where considered appropriate, reference labels have been repeated among the drawings to indicate corresponding or analogous elements. The detailed description particularly refers to the accompanying drawings in which:

FIG. 1 is a simplified diagram illustrating a base plate of a coldplate including a seal plate;

FIGS. 2A and 2B are simplified diagrams illustrating a flow of coolant in a coldplate;

FIG. 3 is a simplified diagram illustrating a plug configured to regulate a flow of coolant in a coldplate;

FIG. 4 is a simplified diagram illustrating a flow of coolant in a portion of a coldplate including the plug;

FIG. 7A is a simplified diagram illustrating a flow of coolant in a portion of a coldplate having valves arranged in a first position;

FIG. 7B is a bottom view of one of the valves in the first position;

FIG. 7C is a cross-sectional view of one of the valves in the first position taken along line 7C-7C of FIG. 7B;

FIG. 8A is a simplified diagram illustrating a flow of coolant in a portion of a coldplate having two valves arranged in the first position and two valves arranged in a second position;

FIG. 8B is a bottom view of one of the valves in the second position;

FIG. 8C is a cross-sectional view of one of the valves in the second position taken along line 8C-8C of FIG. 8B;

FIG. 9 is an exploded view of a coldplate including a plurality of valves;

FIG. 10A is a simplified diagram illustrating a flow of coolant in a coldplate having a plurality of valves arranged in a first combination of positions;

FIG. 10B is a simplified diagram illustrating the flow of coolant in the coldplate of FIG. 10A, with the plurality of valves arranged in a second combination of positions;

FIG. 11A is a top view of one of the valves of FIG. 5 arranged in a third position;

FIG. 11B is a cross-sectional view of the valve in the third position taken along line 11B-11B of FIG. 11A;

FIG. 11C is a cross-sectional view of the valve in a reverse third position;

FIGS. 12A-12D are simplified diagrams illustrating a number of possible coolant flow patterns in the coldplate including valves that are each in one of the first position and the second position;

FIGS. 13A and 13B are isometric views of a valve, according to another embodiment;

FIG. 14 is a simplified diagram illustrating a portion of a coldplate including the valve of FIGS. 13A-B;

FIGS. 15A-15C are simplified diagrams illustrating coolant flow patterns in the portion of the coldplate of FIG. 14, showing the valve movable between a first position, a second position, and a third position;

DETAILED DESCRIPTION OF THE DRAWINGS

Figure 6:
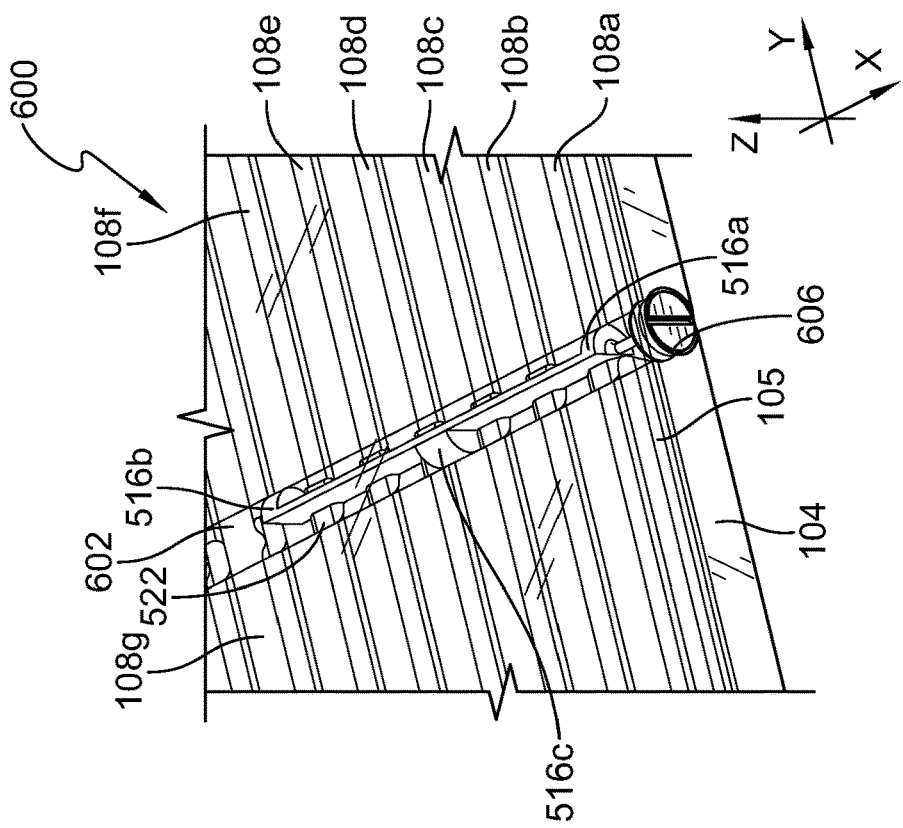
FIG. 6 is a simplified diagram of coolant flow within a portion of a coldplate including the valve of FIG. 5.

While the concepts of the present disclosure are susceptible to various modifications and alternative forms, specific embodiments thereof have been shown by way of example in the figures and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

The present disclosure relates to thermal management systems including matrix coldplates in which a flow of coolant through the coldplate is readily configurable (and reconfigurable) for various applications. By way of example, in some instances, the coldplate flow pattern may be modified by controlling flow to and from a plurality of transverse passages drilled perpendicular to coolant intermediate passages, with each transverse passage connecting several intermediate passages together. In some embodiments, the transverse passages may be grooves or channels whose openings may be sealed by friction welding a seal plate to the ends of the extrusion.

In some embodiments, the openings of the transverse passages may be configured to receive replaceable plugs that allow for through flow in the inlet/outlet passages and establish a serial flow path, e.g., a single flow path followed by the coolant through an area of the coldplate. Accordingly, the replaceable plug may separate the inlet passage or the outlet passage from parallel-flow intermediate passages.

In some embodiments, the transverse passages may be configured to receive one or more flow-splitting valves. These valves may be valves movable among two or more positions (manually or automatically), such that changing a position of the valve changes a flow pattern of the coldplate. Such a modification method allows customization of the coldplate in real time. Features of the valve for controlling flow pattern of the coldplate include, but are not limited to, minimizing restriction of flow through inlet and outlet intermediate passages, allowing for valve position adjustment from exterior of the coldplate, creating inlet for water to enter interior intermediate passages, providing geometry for parallel flow on both sides of the valve, and providing parallel flow geometry on one side of the coldplate, while blocking the flow on the other side. In some embodiments, the positions of one or more valves may be adjusted automatically in response to thermal conditions of the matrix coldplate. By way of example, a controller of a thermal management system may determine that a different coolant flow pattern should be implemented in the matrix coldplate and can reposition one or more of the valves to achieve the different coolant flow pattern. These and other features will be described in more detail below with reference to the drawings accompanying this disclosure.

FIG. 1 illustrates an example thermal management system 100 including a coldplate assembly 102 for circulating coolant to transfer heat away from one or more components disposed adjacent to the coldplate assembly 102. The coldplate assembly 102 includes a base plate 104 defining an inlet passage 105 and an outlet passage 106. The inlet and outlet passages 105, 106 extend longitudinally (y-axis) along opposite sides of a body of the base plate 104. In one example, the inlet passage 105 receives coolant through an inlet opening 112, while the outlet passage 106 expels the coolant through an outlet opening 114.

The base plate 104 defines a plurality of intermediate passages 108 disposed between the inlet and outlet passages 105, 106 and arranged to circulate coolant to transfer heat away from one or more components disposed adjacent to the coldplate assembly 102. In one example, the intermediate passages 108 extend parallel to one another and parallel to the inlet and outlet passages 105, 106 along the length (longitudinally, or along the y-axis) of the base plate 104. The intermediate passages 108 may be spaced apart from one another and from the inlet and outlet passages 105, 106 along a width (laterally, or along the x-axis) of the base plate 104. In the illustrative embodiment, the intermediate passages 108 are evenly distributed over the entire area of the base plate 104.

The intermediate passages 108 of the base plate 104 include openings 122 arranged to receive and expel coolant. A seal plate 110 may connect to a first end 124 of the base plate 104, where the first end 124 of the base plate 104 is disposed opposite a second end 126 of the base plate 104. The seal plate 110 may optionally include seal plate inlet and outlet openings 116, 118 that align with a corresponding one of the inlet opening 112 and the outlet opening 114 of the base plate 104. In other embodiments, the seal plate 110 may only extend to cover the openings 122, but not the inlet opening 112 and the outlet opening 114 of the base plate 104.

The cross-sectional shape of the intermediate passages 108 of a given coldplate assembly 102 may be designed to accommodate a particular purpose of the coldplate assembly 102. In some instances, a specific application of a given coldplate assembly 102 may benefit from maximizing heat transfer efficiency by maximizing a surface area, i.e., a perimeter in two dimensions, of the cross-section of the intermediate passage 108 that comes in direct contact with coolant. Examples of such intermediate passages 108 are shown in the illustrative embodiment.

The base plate 104 may be formed using a near-net extrusion of parallel flow holes. In an example embodiment, such as that shown in FIGS. 1, 2A, and 2B, the base plate 104 may include twelve intermediate passages 108 (or slots) in addition to the inlet and outlet passages 105, 106. As described further below, the base plate 104 may further be formed (e.g., machined) to include one or more transverse passages that connect the intermediate passages 108 and/or the inlet and outlet passages 105, 106. The transverse passages may connect together several sets of parallel-flow intermediate passages 108. Accordingly, depending on arrangement of the transverse passages with respect to one or more intermediate passages 108 of the base plate 104, a given coldplate assembly 102 may be configured to provide either high rate of coolant flow or high coolant dwell time, as discussed further below.

FIG. 2A illustrates an example diagram 200-A of coolant flow pattern in a coldplate 102a. The inlet and outlet passages 105, 106 and the intermediate passages 108 of the coldplate 102a are interconnected with one another by a plurality of transverse passages 214 arranged about each of the first end 124 and the second end 126 of the base plate 104. The transverse passages 214 extend along portions of the width (x-axis) of the base plate 104 in a lateral direction perpendicular to the inlet and outlet passages 105, 106 and to the intermediate passages 108.

In the illustrative embodiment of FIG. 2A, coolant enters 202 the inlet passage 105 about the first end 124 of the base plate 104. Upon entering the base plate 104, the coolant flows 204 from the first end 124 to the second end 126 of the base plate 104. The coolant enters a first transverse passage 214a about the second end 126 of the base plate 104. The first transverse passage 214a connects together the inlet passage 105 and a first subset of intermediate passages 108. In this example, the coolant enters each of the first subset of intermediate passages 108 via the first transverse passage 214a at or about a same time.

The first transverse passage 214a directs 206 the coolant flow from the second end 126 to a second transverse passage 214b disposed at the first end 124 of the base plate 104. The second transverse passage 214b connects the first subset of intermediate passages 108 and a second subset of intermediate passages 108. Upon entering the second transverse passage 214b, coolant flowing through each of the first subset of intermediate passages 108 is directed to the second subset of intermediate passages 108. In this example, the coolant enters each of the second subset of intermediate passages 108 via the second transverse passage 214b at or about a same time.

The second transverse passage 214b directs 208 the coolant flow from the first end 124 to a third transverse passage 214c disposed at the second end 126 of the base plate 104. The third transverse passage 214c connects the second subset of intermediate passages 108 and the outlet passage 106 of the base plate 104. The third transverse passage 214c directs 210 the coolant flowing through each of the second subset of intermediate passages 108 to the outlet passage 106 that expels 212 the coolant.

Accordingly, the example arrangement of the diagram 200-A includes three transverse passages 214 that interconnect the inlet and outlet passages 105, 106 via the intermediate passages 108 to create a four-pass coldplate 102a, in which two of the passes have six parallel flow runs. The exemplary arrangement of the diagram 200-A may be considered a "high-flow" arrangement.

FIG. 2B illustrates an example diagram 200-B of coolant flow pattern in a coldplate 102b. The inlet and outlet passages 105, 106 and the intermediate passages 108 of the coldplate 102b are interconnected with one another by a plurality of transverse passages 236 arranged about each of the first end 124 and the second end 126 of the base plate 104. The transverse passages 236 extend along portions of the width (x-axis) of the base plate 104 in a lateral direction perpendicular to the inlet and outlet passages 105, 106 and to the intermediate passages 108.

In the illustrative embodiment of FIG. 2B, coolant enters 220 the base plate 104 at the inlet passage 105 about the first end 124 and exits 234 the base plate 104 at the outlet passage 106 about the first end 124. Upon entering the base plate 104, the coolant flows 222 along the inlet passage 105 to a first transverse passage 236a that connects together the inlet passage 105 and a first subset of intermediate passages 108. The first subset of intermediate passages 108 directs 224 coolant to a second subset of intermediate passages 108 via a second transverse passage 236b connected therebetween. Likewise, the second subset of intermediate passages 108 direct 226 coolant from the second subset of intermediate passages 108 to a third subset of intermediate passages 108 via a third transverse passage 236c. Further, the third subset of intermediate passages 108 direct 228 coolant to a fourth subset of intermediate passages 108 via a fourth transverse passage 236d. A fifth transverse passage 236e receives 230 coolant from each of the fourth subset of intermediate passages 108 and, subsequently, directs 232 the flow to the outlet passage 106 where the coolant exits 234 the base plate 104.

Accordingly, the example arrangement of the diagram 200-B includes five transverse passages 236 that connect the inlet and outlet passages 105, 106 via the intermediate passages 108 to create a six-pass coldplate 102b. When applied to a twelve-intermediate passage base plate 104, the arrangement of the diagram 200-B includes four subsets of intermediate passages 108 having parallel flow runs, with each set including three intermediate passages 108. A larger number of subsets of intermediate passages 108 and transverse passages 236 increases an amount of time that the coolant spends within the coldplate 102b (also referred to as "dwell time"). Dwell time may be measured as, for example, a time period between a first time when the coolant enters 220 the coldplate 102b and a second time when the coolant exits 234 the coldplate 102b. Accordingly, a dwell time of the coolant in the example arrangement of the diagram 200-B may be greater than a dwell time of the coolant in the example arrangement of the diagram 200-A.

FIG. 3 illustrates a plug 300 configured to regulate the flow of coolant in the coldplate assembly 102. The plug 300 may include a first end portion (head) 302 and a second end portion 304 connected with one another by a connecting rod (shaft) 306. In one example, the connecting rod 306 may extend longitudinally from a center of an inner side 308 of the second end portion 304 to a center of an inner side 310 of the first end portion 302. As shown, by way of example, in FIG. 4, the plug 300 may be configured to be disposed within a transverse passage 402 of the base plate 104 to direct the flow of coolant.

An outer side 312 of the first end portion 302, disposed opposite the inner side 310 of the first end portion 302, includes a drive slot 314. The drive slot 314 is configured to receive a portion of a tool, e.g., a tip of a blade of a screwdriver, during insertion of the plug 300 into the transverse passage. In an example embodiment, the first end portion 302 defines a seal slot 316 disposed about a body 320 of the first end portion 302 extending between the inner and outer sides 310, 312. The seal slot 316 may be configured to receive a seal 318.

FIG. 4 illustrates an example arrangement 400 for the coldplate assembly 102 including the transverse passage 402. In illustrative embodiment, the transverse passage 402 extends laterally with respect to the inlet and outlet passages 105, 106 and the intermediate passages 108, along the width (x-axis) of the base plate 104 about the first end 124. As shown in FIG. 4, the transverse passage 402 extends through to a first side 404 of the base plate 104 to define an opening 406 therein. While the transverse passage 402 shown in FIG. 4 extends from the first side 404 of the base plate 104, the design is not so limited. As described in reference to at least FIGS. 7A and 8A, the transverse passage 402 of the base plate 104 may extend between one or more of the first side 404 of the base plate 104 and a second side (not illustrated) of the base plate 104 disposed opposite the first side 404. The transverse passage 402 may intersect any number of the inlet and outlet passages 105, 106 and the intermediate passages 108 (e.g., the transverse passage 402 may intersect only one of the inlet passage 105 and the outlet passage 106 and only a subset of the intermediate passages 108).

The transverse passage 402 may be configured to receive the plug 300. In an example embodiment, the first end portion 302 of the plug 300 (with or without the seal 318) may be sized to seal the transverse passages opening 406 about the first side 404 of the base plate 104 to prevent fluid flow therethrough. The second end portion 304 of the plug 300 may be sized to seal a first transverse passage portion 407 of the transverse passage 402 that extends between an inner wall 409 of the inlet passage 105 and an outer wall 411 of the intermediate passage 108 immediately adjacent to the inlet passage 105. In the illustrative embodiment shown in FIG. 4, the body 320 of first end portion 302 is sized such that the outer side 312 of the first end portion 302 is flush with the first side 404 of the base plate 104 and the inner side 310 of the first end portion 302 is flush with an outer wall 413 of the inlet passage 105.

The coolant may enter 408 the inlet passage 105 through a connector fitting 405 configured to connect the coldplate assembly 102 to one or more other components (not illustrated) of the thermal management system 100, such as, but not limited to, a coolant pump, a water pump, a heat exchanger, and a cooling tower. When the plug 300 is arranged within the transverse passage 402, the connecting rod 306 of the plug 300 may extend across a width (x-axis) of the inlet passage 105 from the outer wall 413 of the inlet passage 105 to the inner wall 409 of the inlet passage 105. The first end portion 302 of the plug 300 prevents coolant flow between the outer wall 413 of the inlet passage 105 and the first side of the base plate 104. Likewise the second end portion 304 of the plug 300 prevents coolant flow between the inner wall 409 of the inlet passage 105 and the outer wall 411 of the intermediate passage 108 immediately adjacent to the inlet passage 105. The coolant may subsequently pass 410, 412 through the intermediate passages 108 having parallel flow. The second end portion 304 of the plug 300 prevents coolant flow from the intermediate passages 108 into the inlet passage 105. As discussed further below, additional components may be used to redirect coolant flowing the in the intermediate passages 108.

Figure 5:
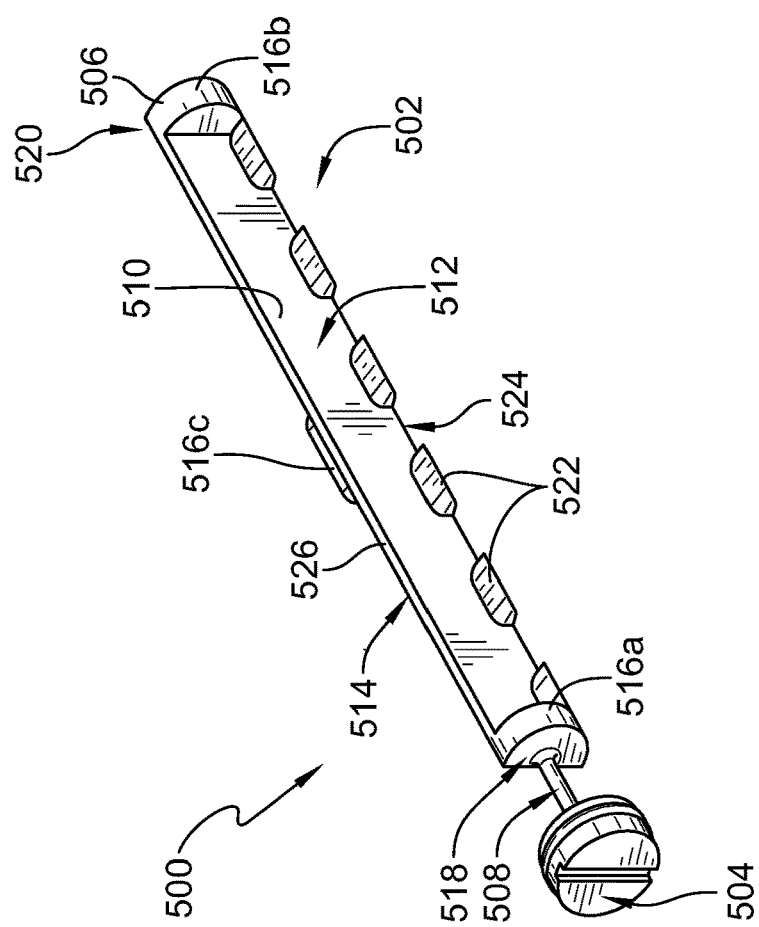
FIG. 5 is an isometric projection view of a valve.

FIG. 5 illustrates an isometric projection view 500 of a valve 502 for controlling flow of coolant through the coldplate assembly 102. While the valve 502 is illustratively embodied as a rotating valve, it is contemplated the valve 502 could be alternatively embodied as a valve that actuates with linear movement or a combination of rotational and linear movements. The valve 502 includes a first end portion 504 and a second end portion 506 connected with one another using a connecting rod 508. In this illustrative embodiment, the first end portion 504 of the valve 502 is substantially similar to the first end portion 302 of the plug 300 described with reference to FIGS. 3 and 4.

The second end portion 506 of the valve 502 includes a protrusion in the form of an elongated spine member 510 having a first spine side 512 and a second spine side 514, where the second spine side 514 is disposed opposite the first spine side 512. Each of the first and second spine sides 512, 514 define a plurality of additional protrusions, such as blocking members 516 (516a, 516b, 516c) and/or parallel flow members 522.

In the illustrative embodiment of the valve 502 shown in FIG. 5, the first spine side 512 of the second end portion 506 defines a first blocking member 516a about a first end 518 of the elongated spine member 510 and a second blocking member 516b about a second end 520 of the elongated spine member 510, where the second end 520 of the elongated spine member 510 is disposed opposite the first end 518 of the elongated spine member 510. The second spine side 514 defines a third blocking member 516c positioned about a center of the second spine side 514 of the elongated spine member 510. Each of the blocking members 516 is illustratively formed as a semicircular protrusion having a flat side that connects to one of the first and second spine sides 512, 514 and an arc side that extends outwardly from the corresponding spine side 512, 514. The blocking members 516 may be shaped such that, when the valve 502 is disposed within the transverse passage 402 of the base plate 104, the blocking members 516 regulate the flow through the intermediate passages 108 and the transverse passage 402 by selectively completing portions of the geometry of the intermediate passages 108 and/or the transverse passage 402. It will be appreciated by those skilled in the art that the number and positioning of the blocking members 516 shown in FIG. 5 are merely exemplary, and that other embodiments of the valve 502 may use other numbers and/or positioning of blocking members 516.

In the illustrative embodiment of the valve 502 shown in FIG. 5, a plurality of parallel flow members 522 extend along a bottom 524 of the elongated spine member 510 (opposite a top 526 of the elongated spine member 510) in a perpendicular manner to the elongated spine member 510. Each of the parallel flow members 522 and the elongated spine member 510, thus, define a T-shape in cross-section (which can best be seen in FIG. 7C). The parallel flow members 522 may be shaped such that, when the valve 502 is disposed within the transverse passage 402 of the base plate 104, the parallel flow members 522 regulate the flow through the intermediate passages 108 and the transverse passage 402 by selectively completing portions of the geometry of the intermediate passages 108 and/or the transverse passage 402. It will be appreciated by those skilled in the art that the number and positioning of parallel flow members 522 shown in FIG. 5 are merely exemplary, and that other embodiments of the valve 502 may use other numbers and/or positioning of parallel flow members 522.

FIG. 6 is a simplified diagram 600 illustrating placement of the valve 502 of FIG. 5 within the coldplate assembly 102. The base plate 104 includes a transverse passage 602 that extends laterally with respect to the inlet passage 105 and the intermediate passages 108 (including intermediate passages 108a, 108b, 108c, 108d, 108e, 108f, 108g), in a similar manner to the transverse passage 402 discussed above with reference to FIG. 4. The transverse passage 602 intersects the inlet passage 105 and the intermediate passages 108 to define a series of junctions. The transverse passage 602 defines an opening 606 where the transverse passage 602 intersects a side of the base plate 104. As illustrated in FIG. 6, the transverse passage 602 is arranged to receive the valve 502 such that the first end portion 504 of the valve 502 seals the opening 606 to prevent flow of coolant through the opening 606. The connecting rod 508 joining together the first and second end portions 504, 506 of the valve 502 extends across a width of the inlet passage 105 to permit coolant flow through the inlet passage 105.

When the valve 502 is positioned in the transverse passage 602 as shown in FIG. 6, each of the parallel flow members 522 aligns with one of the intermediate passages 108a, 108b, 108c, 108d, 108e, 108f. In particular, each of the parallel flow members 522 is positioned in a junction formed between the transverse passage 602 and one of the intermediate passages 108a, 108b, 108c, 108d, 108e, 108f. When the valve 502 is positioned in the transverse passage 602 as shown in FIG. 6, the first blocking member 516a of the valve 502 is disposed within a portion of the transverse passage 602 between the inlet passage 105 and the intermediate passage 108a, the second blocking member 516b of the valve 502 is disposed within a portion of the transverse passage 602 between the intermediate passage 108f and the intermediate passage 108g, and the third blocking member 516c of the valve 502 is disposed within a portion of the transverse passage 602 between the intermediate passage 108c and the intermediate passage 108d. As noted above, it will be appreciated that the number of intermediate passages 108 and the number and positioning of blocking members 516 and parallel flow members 522 shown in FIG. 6 is merely illustrative and that other particular configurations may be used. As will be discussed in greater detail below with respect to FIGS. 7A-C, 8A-C, and 11A-C, the valve 502 may be rotated between several different orientations within the transverse passage 602 to selectively redirect the flow of coolant in the base plate 104.

FIG. 7A illustrates an example arrangement 700-A of a plurality of valves 502 (502a, 502b, 502c, 502d) positioned within a portion of the base plate 104 to control flow of coolant through the base plate 104. Each of the valves 502 has a similar construction to that described above with reference to FIG. 5. As discussed above, the base plate 104 defines the inlet passage 105, the outlet passage 106, and a plurality of intermediate passages 108 between the inlet and outlet passages 105, 106. In the illustrative embodiment of FIG. 7A, the base plate 104 also defines a pair of transverse passages 702, 704 (which are similar to the transverse passages 402, 602 described with reference to FIGS. 4 and 6). The valve 502a is disposed in one end of the transverse passage 702, while the valve 502c is disposed in the other end of the transverse passage 702, such that the respective second ends of the valves 502a, 502c abut one another. The valve 502b is disposed in one end of the transverse passage 704, while the valve 502d is disposed in the other end of the transverse passage 704, such that the respective second ends of the valves 502b, 502d abut one another.

In FIGS. 7A-7C, each of the valves 502 is arranged in a first position in which the parallel flow members 522 are orientated away from the intermediate passages 108. FIG. 7B illustrates a bottom view 700-B (as seen from a bottom 742 of the base plate 104) of the valve 502a disposed in the first position. The valve 502a includes a connecting rod 508 that extends across the inlet passage 105 to permit unobstructed coolant flow through the inlet passage 105. The connecting rod 508 connects the first end portion 504 and the second end portion 506. As discussed further below, the elongated spine member 510, the first and second blocking members 516a, 516b disposed on the first spine side 512, and the third blocking member 516c disposed on the second spine side 514 redirect the flow of coolant through the base plate 104.

With reference to FIG. 7A, the connecting rod 508 of the first valve 502a permits coolant to flow past the connecting rod 508 through the inlet passage 105. While the first blocking member 516a of the first valve 502a prevents the coolant from entering the first transverse passage 702 about the first spine side 512, coolant flow enters the first transverse passage 702 about the second spine side 514 of the first valve 502a. The third blocking member 516c of the first valve 502a directs coolant through a first subset of the intermediate passages 108 toward the second transverse passage 704.

When coolant reaches the second transverse passage 704, the first blocking member 516a of the second valve 502b directs the coolant along the first spine side 512 of the second valve 502b and toward a second subset of the intermediate passages 108. The second blocking member 516b of the second valve 502b then directs the flow of coolant through the second subset of intermediate passages 108, back toward the first transverse passage 702.

When coolant returns to the first transverse passage 702, the third blocking member 516c of the first valve 502a directs the coolant along the second spine side 514 of the first valve 502a, along the second spine side 514 of the third valve 502c, and toward a third subset of the intermediate passages 108. The third blocking member 516c of the third valve 502c then directs the flow of coolant through the third subset of intermediate passages 108, back toward the second transverse passage 704.

When coolant returns to the second transverse passage 704, the second blocking member 516b of the fourth valve 502d directs the coolant along the first spine side 512 of the fourth valve 502d and toward a fourth subset of the intermediate passages 108. The first blocking member 516a of the fourth valve 502d then directs the flow of coolant through the fourth subset of intermediate passages 108, back toward the first transverse passage 702.

When coolant returns to the first transverse passage 702, the third blocking member 516c of the third valve 502c directs the coolant along the second spine side 514 of the third valve 502c and toward the outlet passage 106. The connecting rod 508 of the third valve 502c permits coolant to flow past the connecting rod 508 through the outlet passage 106. The first blocking member 516a of the third valve 502c prevents the coolant from reentering the transverse passage 702 along the first spine side 512 of the third valve 502c.

FIG. 7C illustrates a cross-sectional view 700-C showing a cross-section of the first valve 502a, taken along line 7C-7C of FIG. 7B. The intermediate passage 108 of the base plate 104 is defined between a first surface 748 and a second surface 740 of a bottom 742 of the base plate 104. As can be seen in FIG. 7C, when the first valve 502a is in the first position, the top 526 of the elongated spine member 510 abuts the second surface 740 of the base plate 104, presenting a barrier to the flow 744, 746 of coolant through the intermediate passage 108. In other words, when the first valve 502a is in the first position, the elongated spine member 510 prevents (or at least impedes) coolant from flowing from the first spine side 512 to the second spine side 514, or vice versa. However, when the first valve 502a is in the first position, coolant is permitted to flow along the first spine side 512 between intermediate passages 108 of the base plate 104, at least until the coolant encounters the first blocking member 516a or the second blocking member 516b. Similarly, when the first valve 502a is in the first position, coolant is permitted to flow along the second spine side 514 between intermediate passages 108 of the base plate 104, at least until the coolant encounters the third blocking member 516c.

FIG. 8A illustrates an example arrangement 800-A of a plurality of valves 502 (502a, 502b, 502c, 502d) positioned within a portion of the base plate 104 to control flow of coolant through the base plate 104. Each of the valves 502 has a similar construction to that described above with reference to FIG. 5. As discussed above, the base plate 104 defines the inlet passage 105, the outlet passage 106, and a plurality of intermediate passages 108 between the inlet and outlet passages 105, 106. In the illustrative embodiment of FIG. 8A, the base plate 104 also defines a pair of transverse passages 702, 704 (which are similar to the transverse passages 702, 704 described with reference to FIG. 7A). The valve 502a is disposed in one end of the transverse passage 702, while the valve 502c is disposed in the other end of the transverse passage 702, such that the respective second ends of the valves 502a, 502c abut one another. The valve 502b is disposed in one end of the transverse passage 704, while the valve 502d is disposed in the other end of the transverse passage 704, such that the respective second ends of the valves 502b, 502d abut one another.

In the arrangement 800-A of FIG. 8A, the second and fourth valves 502b, 502d are arranged in the first position and function in the same manner discussed above with reference to FIG. 7A. The first and third valves 502a, 502c, however, are arranged in a different second position in FIG. 8A (see also FIGS. 8B and 8C). Each of the valves 502 may be rotated in its respective transverse passage 702, 704 between a number of different positions (including the first and second positions), for example, by using a tip of a screwdriver blade inserted into a drive slot on the first end portion 504 of the valve 502. In some embodiments, the first end portion 504 of each valve 502 and/or a surrounding portion of the base plate 104 may contain indicia that indicate the position occupied the corresponding valve 502.

When the first and third valves 502a, 502c are arranged in the second position, shown in FIGS. 8A-8C, the parallel flow members 522 are positioned in the intermediate passages 108. As can be best appreciated from FIGS. 8B and 8C, the orientation of the first and third valves 502a, 502c in the second position is opposite (e.g., 180 degrees rotated from) the orientation of the first and third valves 502a, 502c when in the first position shown in FIGS. 7B and 7C. FIG. 8B illustrates a bottom view 800-B (as seen from a bottom 742 of the base plate 104) of the valve 502a disposed in the second position. When the valve 502a is in this second position, the each of the parallel flow members 522a, 522b, 522c, 522d, 522e, 522f is positioned in a corresponding one of the intermediate passages 108a, 108b, 108c, 108d, 108e, 108f (see FIG. 7A). Each parallel flow member 522a, 522b, 522c, 522d, 522e, 522f completes the geometry of the corresponding intermediate passage 108a, 108b, 108c, 108d, 108e, 108f, allowing coolant to flow through each intermediate passage 108, but preventing (or at least impeding) coolant from entering the transverse passage 702 in which the first valve 502a is positioned.

FIG. 8C illustrates a cross-sectional view 800-C showing a cross-section of the first valve 502a, taken along line 8C-8C of FIG. 8B. As discussed above, the intermediate passage 108 of the base plate 104 is defined between a first surface 748 and a second surface 740 of a bottom 742 of the base plate 104. As can be seen in FIG. 8C, when the first valve 502a is in the second position, the parallel flow member 522d completes the first surface 748 forming the top of the intermediate passage 108d, thereby allowing coolant flow 802 along the intermediate passage 108d. Additionally, the sides of the parallel flow member 522d prevent (or at least impede) coolant from flowing from the intermediate passage 108d into the transverse passage 702. Each of the remaining parallel flow members 522a, 522b, 522c, 522e, 522f of the first valve 502a functions in a similar manner with respect to the remaining intermediate passages 108a, 108b, 108c, 108e, 108f.

With reference to FIG. 8A, when coolant flowing along the intermediate passage 108a encounters the first valve 502a arranged in the second position, the coolant passes through the parallel flow member 522a of the first valve 502a and continues flowing along the next section of intermediate passage 108a toward the second transverse passage 704. Similarly, when coolant flowing along the intermediate passage 108b encounters the first valve 502a arranged in the second position, the coolant passes through the parallel flow member 522b of the first valve 502a and continues flowing along the next section of intermediate passage 108b toward the second transverse passage 704. In the same manner, when coolant flowing along the intermediate passage 108c encounters the first valve 502a arranged in the second position, the coolant passes through the parallel flow member 522c of the first valve 502a and continues flowing along the next section of intermediate passage 108c toward the second transverse passage 704.

When coolant reaches the second transverse passage 704 (from the intermediate passages 108a, 108b, 108c), the first blocking member 516a of the second valve 502b directs the coolant along the first spine side 512 of the second valve 502b and toward the intermediate passages 108d, 108e, 108f. The second blocking member 516b of the second valve 502b then directs the flow of coolant through each of the intermediate passages 108d, 108e, 108f back toward the first valve 502a.

When coolant flowing along the intermediate passage 108d encounters the first valve 502a arranged in the second position, the coolant passes through the parallel flow member 522d of the first valve 502a and continues flowing along the next section of intermediate passage 108d. Similarly, when coolant flowing along the intermediate passage 108e encounters the first valve 502a arranged in the second position, the coolant passes through the parallel flow member 522e of the first valve 502a and continues flowing along the next section of intermediate passage 108e. In the same manner, when coolant flowing along the intermediate passage 108f encounters the first valve 502a arranged in the second position, the coolant passes through the parallel flow member 522f of the first valve 502a and continues flowing along the next section of intermediate passage 108f.

FIG. 9 illustrates an example arrangement 900 of the coldplate assembly 102, in which eight valves 904a-904h are arranged in pairs in each of four transverse passages 906a-906d of the base plate 902. Each of the eight valves 904a-904h can moved between a plurality of positions (including the first and second positions described above) to configure the coldplate assembly 102 for a variety of applications. While the arrangement 900 is illustrated in FIG. 9 as having four transverse passages 906 and eight valves 904, it is contemplated that any number of transverse passages and valves could be used. For instance, in some embodiments, a base plate may include eight or sixteen transverse passages configured to receive sixteen or thirty-two valves, respectively.

FIGS. 10A and 10B illustrate two example flow paths 1000-A, 1000-B, respectively, for a coldplate 1002 configured to cool a component 1004. Using valves of the type discussed above, the coldplate 1002 may be readily changed between the flow path 1000-A and the flow path 1000-B by changing the position of certain of the valves. As discussed further below, changing the coldplate 1002 between the flow path 1000-A and the flow path 1000-B may change a preheat area parameter indicative of an area of the coldplate 1002 travelled by coolant from an inlet passage 1008 prior to reaching the component 1004.

The coldplate 1002 comprises a first transverse passage 1006a extending along x-axis between the inlet passage 1008 and an outlet passage 1010 about a first end 1012 of the coldplate 1002. The coldplate 1002 also comprises a second transverse passage 1006b extending along x-axis between the inlet passage 1008 and the outlet passage 1010 about a second end 1014 of the coldplate 1002. The coldplate 1002 also comprises a third transverse passage 1006c and a fourth transverse passage 1006d each extending along x-axis between the inlet passage 1008 and the outlet passage 1010 at intermediate positions between the first and second ends 1012, 1014 of the coldplate 1002. Similar the coldplates discussed above, the cold plate comprises a plurality of intermediate passages 1016 extending parallel to the inlet and outlet passages 1008, 1010 and intersecting the first, second, third, and fourth transverse passages 1006a, 1006b, 1006c, 1006d. A pair of valves is disposed in each of the first, second, third, and fourth transverse passages 1006a, 1006b, 1006c, 1006d and functions in the manner discussed above with reference to FIGS. 5-8C.

To achieve the flow path 1000-A, shown in FIG. 10A, the valves in transverse passage 1006a and the valves in transverse passage 1006b are each orientated in the first position (described above with reference to FIGS. 7A-7C), while the valves in transverse passage 1006c and the valves in transverse passage 1006d are each orientated in the second position (described above with reference to FIGS. 8A-8C). As such, coolant is redirected laterally in the transverse passages 1006a, 1006b by the valves arranged in the first position. However, coolant does not travel in the transverse passages 1006c, 1006d, but continues flowing along the respective intermediate passages 1016 as directed by the valves arranged in the second position. When following flow path 1006-A, shown in FIG. 10A, coolant travels over and collects heat from approximately 85% of the total area of the coldplate 1002 before reaching the component 1004.

To achieve the flow path 1000-B, shown in FIG. 10B, the valves in transverse passage 1006c and the valves in transverse passage 1006d are each re-orientated to the first position (described above with reference to FIGS. 7A-7C), while valves in transverse passage 1006a and the valves in transverse passage 1006b remain orientated in the same first position. As such, at least a portion of the coolant is redirected laterally in each of the transverse passages 1006a, 1006b, 1006c, 1006d by the valves arranged in the first position. When coolant follows flow path 1006-B, shown in FIG. 10B, the portion of the coolant that reaches the component 1004 has only traveled over and collected heat from approximately 20% of the total area of the coldplate 1002 before reaching the component 1004. In some embodiments, the valves in transverse passage 1006c and the valves in transverse passage 1006d are each re-orientated, as described above, manually by a user to change between the flow paths 1000-A and 1000-B. In other embodiments, the valves in transverse passages 1006c, 1006d are re-orientated automatically (e.g., by a controller and electro-actuators) in response to thermal conditions of the matrix coldplate.

Referring now to FIGS. 11A and 11B, a top view 1100-A and a side cross-sectional view 1100-B of one of the valves 502 disposed in a third position within a transverse passage 702 of the base plate 104 are illustrated. The valve 502 has a similar construction to that described above with reference to FIG. 5. When arranged in the third position, a first side 528 of each parallel flow member 522 of the valve 502 is positioned in the intermediate passage 108 corresponding to that parallel flow member 522, while a second side 530 of each parallel flow member 522 of the valve 502 is positioned out of the intermediate passage 108 corresponding to that parallel flow member 522 (best seen in the cross-section of FIG. 11B). In this position, each parallel flow member 522 caps off the portion of the corresponding intermediate passage 108 faced by the parallel flow member 522. In this way, each parallel flow member 522 prevents (or at least impedes) a flow 746 of coolant approaching the valve 502 from a first side from either entering the transverse passage 702 or continuing along the intermediate passage 108 (when the valve is in the third position shown in FIG. 11B). At the same time, a flow 744 of coolant approaching the valve 502 from a second side (opposite the first side) is redirected from the intermediate passage 108 along the second spine side 514 of the valve 502, along the transverse passage 702. (In this way, the flows 744 of coolant shown in both FIGS. 7C and 11B behave in a similar manner, when the valve 502 is in the first or third position.)

Referring now to FIG. 11C, a side cross-sectional view 1100-C of one of the valves 502 disposed in a fourth position within a transverse passage 702 of the base plate 104 is illustrated. As will be appreciated by comparing FIG. 11C to FIG. 11B, the fourth position of the valve 502 is a "mirror image" of the third position flipped along z-axis direction of the coldplate assembly 102. When the valve is arranged in the fourth position, shown in FIG. 11C, the second side 530 of each parallel flow member 522 of the valve 502 is positioned in the intermediate passage 108 corresponding to that parallel flow member 522, while the first side 528 of each parallel flow member 522 of the valve 502 is positioned out of the intermediate passage 108 corresponding to that parallel flow member 522. In this fourth position (like the third position), each parallel flow member 522 caps off the portion of the corresponding intermediate passage 108 faced by the parallel flow member 522. As such, when the valve 502 is in the fourth position, each parallel flow member 522 prevents (or at least impedes) a flow 744 of coolant approaching the valve 502, from the second side, from either entering the transverse passage 702 or continuing along the intermediate passage 108. At the same time, a flow 746 of coolant approaching the valve 502 from the first side is redirected from the intermediate passage 108 along the first spine side 512 of the valve 502, along the transverse passage 702. (In this way, the flows 746 of coolant shown in both FIGS. 7C and 11C behave in a similar manner, when the valve 502 is in the first or fourth position.)

FIGS. 12A-12D illustrate four exemplary flow paths 1200-A, 1200-B, 1200-C, and 1200-D, respectively, for the illustrative coldplate 1002. The structure of the illustrative coldplate 1002 is described above with reference to FIGS. 10A-B. Using valves of the type discussed above, the coldplate 1002 may be readily changed between any of the flow paths 1200-A, 1200-B, 1200-C, and 1200-D by changing the position of certain of the valves. As discussed above, both manual and automatic repositions of the valves, to achieve various regions of parallel flow, serial flow, and/or blocked flow (and, thus, the various flow paths 1200-A, 1200-B, 1200-C, and 1200-D), is contemplated.

Similar to FIG. 10B discussed above, FIG. 12A illustrates a flow path 1200-A of the coldplate 1002 in which all of the valves (positioned in each of the transverse passages 1006a, 1006b, 1006c, 1006d) are arranged in the first position (described above with reference to FIGS. 7A-C). When the valves positioned in the transverse passages 1006a, 1006c are each arranged in the first position, a first coolant flow area 1212 of the coldplate 1002 is defined between the transverse passages 1006a, 1006c. Similarly, when the valves positioned in the transverse passages 1006c, 1006d are each arranged in the first position, a second coolant flow area 1214 of the coldplate 1002 is defined between the transverse passages 1006c, 1006d. Likewise, when the valves positioned in the transverse passages 1006b, 1006d are each arranged in the first position, a third coolant flow area 1216 of the coldplate 1002 is defined between the transverse passages 1006b, 1006d. In one example, each of the coolant flow areas 1212, 1214, and 1216 provides somewhat independent thermal management for one or more components (not illustrated) disposed adjacent to the respective flow area. Accordingly, temperature of the coolant circulated within each of the flow areas 1212, 1214, 1216 is largely unaffected by temperature changes in the other flow areas.

FIG. 12B illustrates a flow path 1200-B of the coldplate 1002 similar to FIG. 12A, but in which the valves in the transverse passage 1006d have been arranged in the second position (described above with reference to FIGS. 8A-C). As such, in the flow path 1200-B, coolant is prevented (or largely impeded) from flowing along the transverse passage 1006d and instead flows along the intermediate passages 1016 between the through transverse passages 1006b and 1006c. In effect, the flow areas 1214 and 1216 discussed with reference to FIG. 12A are joined together to create a new, larger flow area 1218, defined between the transverse passages 1006b, 1006c. As discussed above, the flow area 1218 is able to operate somewhat independently of the flow area 1212, such that the temperature of the coolant circulated within each of the flow areas 1212, 1218 is largely unaffected by temperature changes in the other flow area.

FIG. 12C illustrates a flow path 1200-C of the coldplate 1002 similar to FIG. 12A, but in which the valves in the transverse passage 1006c have been arranged in the second position (described above with reference to FIGS. 8A-C). As such, in the flow path 1200-C, coolant is prevented (or largely impeded) from flowing along the transverse passage 1006c and instead flows along the intermediate passages 1016 between the through transverse passages 1006a and 1006c. In effect, the flow areas 1212 and 1214 discussed with reference to FIG. 12A are joined together to create a new, larger flow area 1220, defined between the transverse passages 1006a, 1006d. As discussed above, the flow area 1220 is able to operate somewhat independently of the flow area 1216, such that the temperature of the coolant circulated within each of the flow areas 1216, 1220 is largely unaffected by temperature changes in the other flow area.

FIG. 12D illustrates a flow path 1200-D of the coldplate 1002 similar to FIG. 12A, but in which the valves in the both of the transverse passages 1006c, 1006d have been arranged in the second position (described above with reference to FIGS. 8A-C). As such, in the flow path 1200-D, coolant is prevented (or largely impeded) from flowing along the transverse passages 1006c, 1006d and instead flows along the intermediate passages 1016 between the through transverse passages 1006a and 1006b. In effect, all three flow areas 1212, 1214, 1216 discussed with reference to FIG. 12A are joined together to create a new, larger flow area 1222, defined between the transverse passages 1006a, 1006b. In this way, the flow path 1200-D is similar to the flow path 1000-A discussed above with reference to FIG. 10A.

Additional exemplary flow paths for the coldplate 1002 can be created by moving one or more of the valves of the coldplate 1002 into the third and/or fourth positions described above with reference to FIGS. 11A-C. By way of example, with reference to the diagrams of FIGS. 12A and 12C, if the valves positioned in the transverse passage 1006d were arranged in the fourth position of FIG. 11C (rather than the first position of FIGS. 7A-C), the valves positioned in the transverse passage 1006*d* would block the flow of coolant into the portions of the intermediate passages 1016 extending between the transverse passages 1006*b*, 1006*d*, thereby converting the area 1216 into a "dry area" with no coolant flow (while permitting the flow areas 1212, 1214, 1220 to operate as described above). As another example, with reference to FIG. 12A, if the valves positioned in the transverse passage 1006*d* were arranged in the third position of FIGS. 11A-B, while the valves positioned in the transverse passage 1006*c* were arranged in the fourth position of FIG. 11C, those valves would block the flow of coolant into the portions of the intermediate passages 1016 extending between the transverse passages 1006*c*, 1006*d*, thereby converting the area 1214 into a "dry area" with no coolant flow (while permitting the flow areas 1212, 1216 to operate as described above). It will be appreciated by those skilled in the art that the foregoing configurations are merely exemplary and illustrative in nature, and that many additional configurations and flow paths can be achieved with the matrix coldplates of the present disclosure.

FIGS. 13A-B illustrate isometric views 1300-A and 1300-B, respectively, of another illustrative embodiment of a valve 1302. The valve 1302 defines a body 1316 having, for example, a cylindrical shape. A drive slot 1318, defined in a proximal end portion 1304 of the body 1316, is configured to receive a portion of a hand tool (not illustrated), such that the valve 1302 may be re-oriented with respect to base plate 1400 of a coldplate assembly. A distal end portion 1306 of the body 1316 comprises a number of protrusions, including a center ridge 1310, a first rim 1312*a*, and a second rim 1312*b*. A first depression 1308*a* and a second depression 1308*b* are defined in the distal end portion 1306 of the body 1316 to either side of the center ridge 1310. In the illustrative embodiment of FIGS. 13A-B, the first depression 1308*a* is defined between the center ridge 1310 and the first rim 1312*a*, while the second depression 1308*b* is defined by the center ridge 1310 and the second rim 1312*b*.

FIG. 14 illustrates a coldplate assembly including the valve 1302 for controlling coolant flow within the base plate 1400. The base plate 1400 defines a first intermediate passage 1402 and a second intermediate passage 1404 extending longitudinally and disposed adjacent one another. In one example, the first intermediate passage 1402 extends parallel to the second intermediate passage 1404. In another example, the first intermediate passage 1402 and the second intermediate passage 1404 extend parallel to an outlet passage 1408 and/or an inlet passage (not illustrated) arranged to expel or deliver coolant to the base plate 1400, respectively.

In the illustrative embodiment of FIG. 14, the valve 1302 is received in a transverse passage 1406 that extends from a top surface 1410 of the base plate 1400 toward a bottom of the base plate 1400 (but does not reach or pass through the bottom of the base plate 1400). The transverse passage 1406 intersects the first intermediate passage 1402 and the second intermediate passage 1404 define in the base plate 1400. In an example, the transverse passage 1406 is a counterbore opening defining a ledge 1414 arranged to receive a corresponding lip 1314 disposed around a circumference of the body 1316 of the valve 1302. In the illustrative embodiment, each of the first depression 1308*a* and the second depression 1308*b* are sized to correspond to the geometry of the first intermediate passage 1402 and the second intermediate passage 1404, respectively. The center ridge 1310 is sized to span the area between the first intermediate passage 1402 and the second intermediate passage 1404. As described in further detail with reference to at least FIGS. 15A-C, the valve 1302 may be movable between at least two positions to control coolant flow through and between the first intermediate passage 1402 and the second intermediate passage 1404.

FIGS. 15A-C illustrate the valve 1302 movable between a plurality of positions to control coolant flow patterns within a base plate 1400. FIG. 15A illustrates an example configuration 1500-A of the base plate 1400 including the valve 1302 disposed in a first position within the transverse passage 1406. In this first position, the first depression 1308*a* of the valve 1302 is aligned longitudinally with the first intermediate passage 1402 and the second depression 1308*b* of the valve 1302 is aligned with the second intermediate passage 1404. When the valve 1302 is in the first position shown in FIG. 15A, coolant is permitted to flow through the first intermediate passage 1402 relatively unimpeded by the valve 1302, and coolant is likewise permitted to flow through the second intermediate passage 1404 relatively unimpeded by the valve 1302.

FIG. 15B illustrates an example configuration 1500-B of the base plate 1400 including the valve 1302 disposed in a second position within the transverse passage 1406. In the illustrative embodiment, the valve 1302 has been rotated 90 degrees within the transverse passage 1406, to change from configuration 1500-A to configuration 1500-B. In the second position, the first depression 1308*a* extends between and interconnects adjacent portions of the first and second intermediate passages 1402, 1404, while the second depression 1308*b* extends between and interconnects other adjacent portions of the first and second intermediate passages 1402, 1404. When the valve 1302 is in the second position shown in FIG. 15B, the first depression 1308*a* redirects coolant from the first intermediate passage 1402 to the second intermediate passage 1404 (or vice versa, depending on flow directions). Similarly, when the valve 1302 is in the second position shown in FIG. 15B, the second depression 1308*b* redirects coolant from the second intermediate passage 1404 to the first intermediate passage 1402 (or vice versa, depending on flow directions).

FIG. 15C illustrates an example configuration 1500-C of the base plate 1400 including the valve 1302 disposed in a third position within the transverse passage 1406. In the illustrative embodiment, the valve 1302 has been rotated 45 degrees within the transverse passage 1406, to change from either configuration 1500-A or 1500-B to configuration 1500-C. In the third position shown in FIG. 15C, the first and second depressions 1308*a*, 1308*b* are each positioned diagonally (non-parallel and non-perpendicular) to the first and second intermediate passages 1402, 1404, such that neither the first depression 1308*a* nor the second depression 1308*b* intersects more than one segment of the first and second intermediate passages 1402, 1404. As such, no coolant flow is permitted through the first and second depressions 1308*a*, 1308*b* (or through the first and second intermediate passages 1402, 1404) when the valve 1302 is in the third position.

FIGS. 16A-D illustrate portions of yet another embodiment of a coldplate 1602 according to the present disclosure. The coldplate 1602 includes a base plate 1604 of similar construction to the base plates described above (e.g. base plate 104). Among other similar features, the base plate 1604 includes an inlet passage 1605, an outlet passage 1606, and a plurality of intermediate passages 1608 disposed between the inlet and outlet passages 1605, 1606 and arranged to circulate coolant to transfer heat away from one or more components disposed adjacent to the coldplate assembly 102. In the illustrative example, the intermediate passages 1608 extend parallel to one another and parallel to the inlet and outlet passages 1605, 1606 along the length (longitudinally, or along the y-axis) of the base plate 1604 and are spaced apart from one another and from the inlet and outlet passages 1605, 1606 along a width (laterally, or along the x-axis) of the base plate 1604.

Like the base plates discussed above, the base plate 1604 also includes transverse passages 1610 that intersect and connect at least some of the intermediate passages 1608 and the inlet and outlet passages 1605, 1606 to one another. As discussed above, this transverse passages 1610 may be machined (e.g., milled) into the extruded base plate 1604 including the intermediate passages 1608 and the inlet and outlet passages 1605, 1606. In the illustrative embodiment shown in FIG. 16A, one transverse passage 1610 is arranged near a first end 1612 of the base plate 1604, while another transverse passage 1610 is arranged near a second end 1614 of the base plate 1604.

Figure 16A:
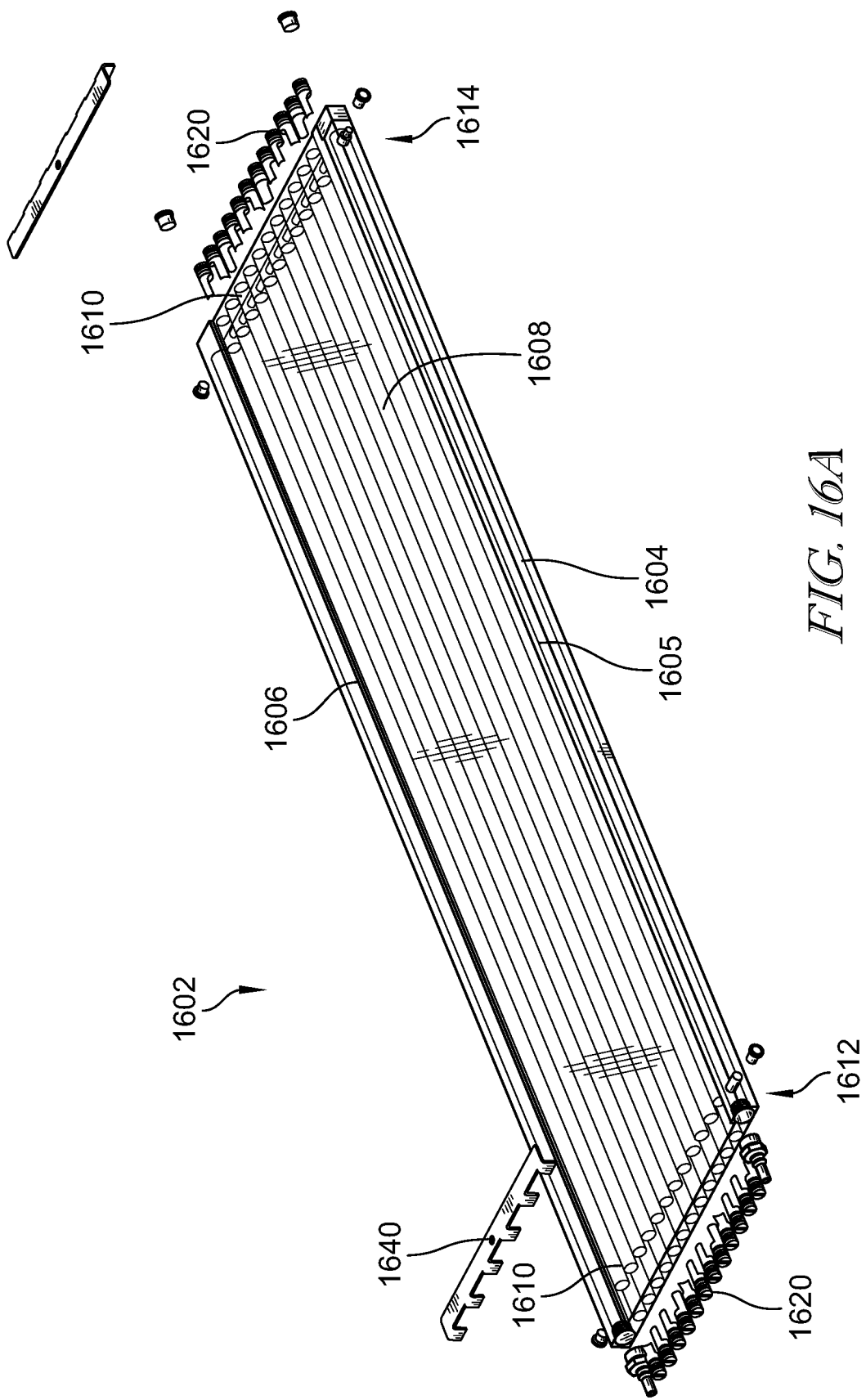
FIG. 16A is an exploded view of a coldplate including a plurality of valves, according to yet another embodiment.
Figure 16B:
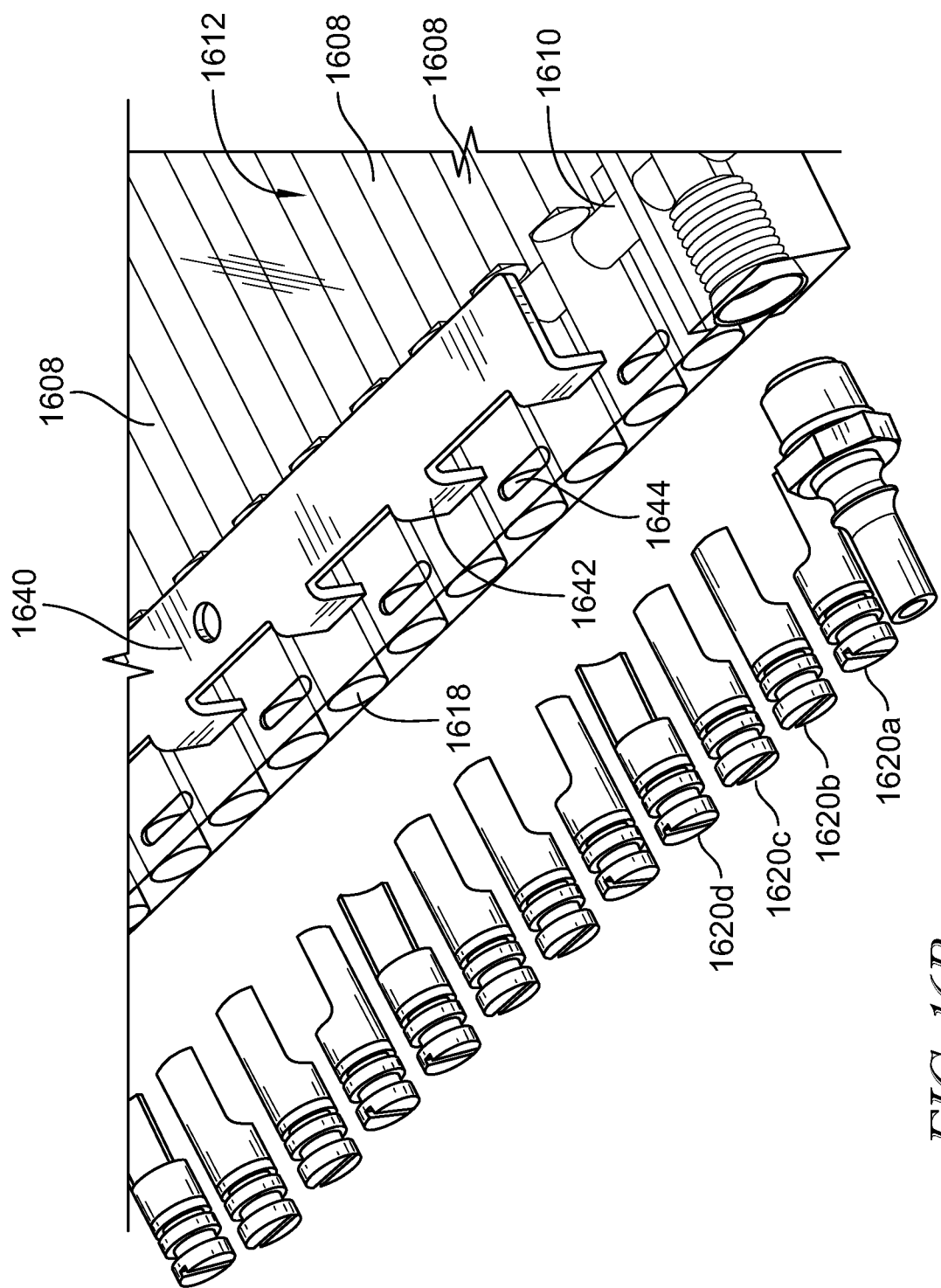
FIG. 16B is an enlarged, detail view of a portion of the exploded view of the coldplate of FIG. 16A.

Referring now to FIG. 16B, a more detailed exploded view of the first end 1612 of the coldplate 1602 is illustrated. The coldplate 1602 further includes a plurality of valves 1620 (with four such valves 1620a, 1620b, 1620c, and 1620d being labelled in FIG. 16B). In the illustrative embodiment of FIGS. 16A-D, two valves 1620 are provided for each intermediate passage 1608 (one valve 1620 at the first end 1612 of the intermediate passage 1608, and another valve 1620 at the second end 1614 of the intermediate passage 1608). As suggested by FIG. 16B, a generally cylindrical bore 1618 is provided at each end 1612, 1614 of each intermediate passage 1608 for receiving a corresponding valve 1620. In the illustrative embodiment, the transverse passage 1610 intersects the cylindrical bores 1618 of each intermediate passage 1608 at one of the ends 1612, 1614.

Figure 16D:
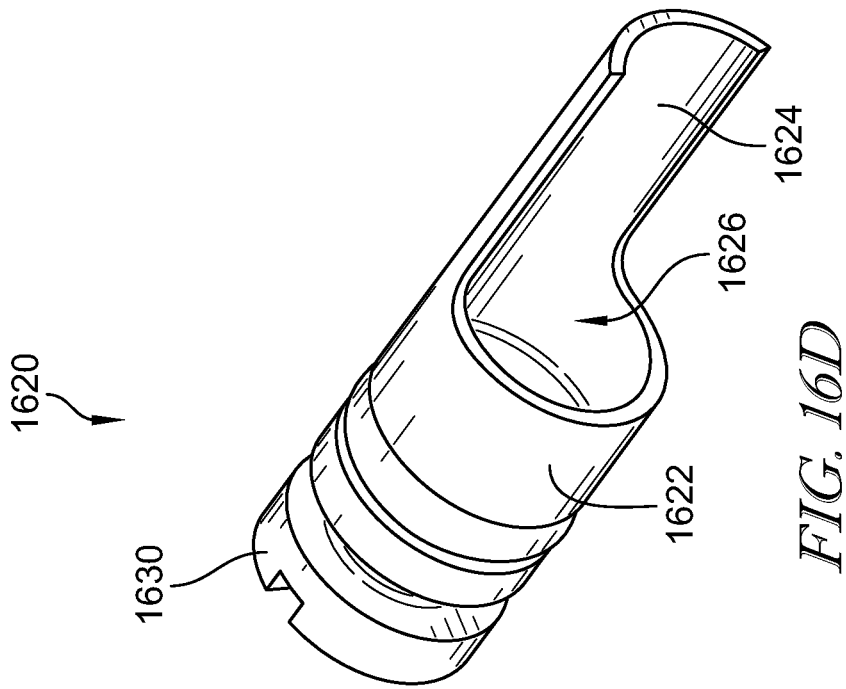
FIGS. 16C and 16D are istometric views of one of the valves of FIGS. 16A-B.
Figure 16C:
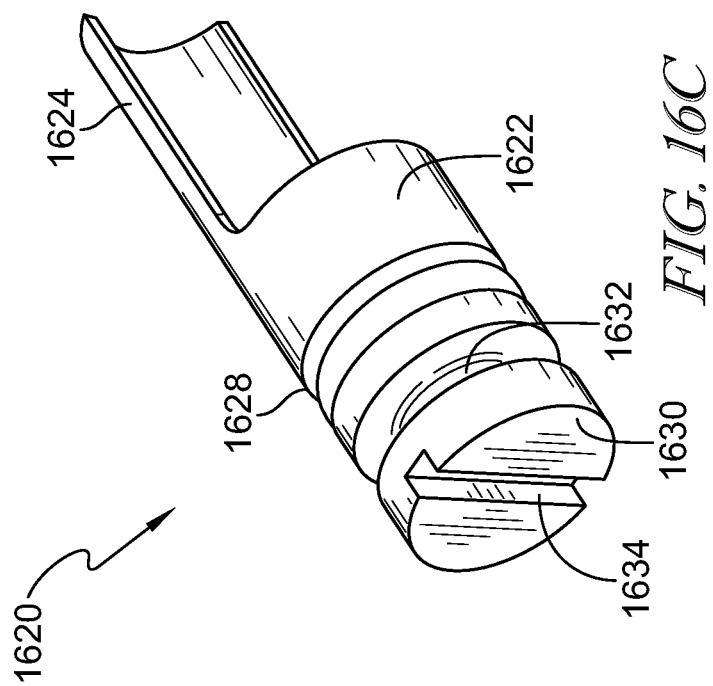

With reference to FIGS. 16C-D, each valve 1620 has a generally cylindrical body 1622. A protrusion 1624 extends from a distal end 1626 of the body 1622. In the illustrative embodiment, the protrusion 1624 is shaped as a cylindrical wall segment. The valve 1620 may include a gasket 1628 seated in a circumferential groove of the body 1622 and configured to seal one of the cylindrical bores 1618 of the base plate 1604 when the valve is positioned in that cylindrical bore 1618. The valve 1620 also includes a head 1630 connected to a proximal end of the body 1622 via a neck 1632. In the illustrative embodiment, the neck 1632 is of smaller diameter than the body 1622 and the head 1630 and includes one or more surfaces configured to engage a lock clip 1640 (see FIG. 16B, discussed further below). Additionally, in the illustrative embodiment, the head 1630 includes a drive slot 1634 configured to receive a portion of a tool, e.g., a tip of a blade of a screwdriver, during insertion or adjustment (e.g., rotation) of the valve 1620 in the cylindrical bore 1618.

Referring again to FIG. 16B, each of the valves 1620 may be independently adjusted (e.g. rotated) between a number of different positions to adjust the flow behavior of the coldplate 1602. As shown in FIG. 16B, the valve 1620a is arranged in a first position relative to the coldplate 1602. When a valve 1620 assumes this first position, the protrusion 1624 faces the inlet passage 1605 of the coldplate 1602 and prevents coolant flow between the corresponding intermediate passage 1608 (in which the valve 1620 is positioned) and a section of the transverse passage 1610 extending away from the corresponding intermediate passage 1608 toward the inlet passage 1605. While in this first position, however, the valve 1620 redirects coolant flow between the corresponding intermediate passage 1608 and a section of the transverse passage 1610 extending away from the corresponding intermediate passage 1608 toward the outlet passage 1606.

As also shown in FIG. 16B, the valves 1620d is arranged in a second position relative to the coldplate 1602. When a valve 1620 assumes this second position, the protrusion 1624 faces the outlet passage 1606 of the coldplate 1602 and prevents coolant flow between the corresponding intermediate passage 1608 (in which the valve 1620 is positioned) and a section of the transverse passage 1610 extending away from the corresponding intermediate passage 1608 toward the outlet passage 1606. While in this first position, however, the valve 1620 redirects coolant flow between the corresponding intermediate passage 1608 and a section of the transverse passage 1610 extending away from the corresponding intermediate passage 1608 toward the inlet passage 1605.

The valves 1620 are also able to be moved to a third position, exemplified by the valves 1620b and 1620c shown in FIG. 16B. When a valve 1620 assumes this third position, the protrusion 1624 faces an upper surface of the base plate 104 and does not block coolant flow to any section of the transverse passage 1610. While in this third position, the valve 1620 allows relatively unimpeded coolant flow along the transverse passage 1610 and also allows coolant flow between the transverse passage 1610 and the corresponding intermediate passage 1608 (in which the valve 1620 is positioned). Each of the plurality of valves 1620 of the coldplate 1602 may be independently arranged in any of these (and other) positions, providing a high degree of flexibility and customization of the coldplate 1602 for various applications.

FIGS. 16A-B also illustrate a lock clip 1640 that may be used with the coldplate 1602 to hold each of the valves 1620 in one of a number of predetermined positions. The lock clip 1640 includes a number of teeth 1642 configured to be received in corresponding passages 1644 in the base plate 1604. In the illustrative embodiment shown in FIG. 16B, one such passage is positioned between each pair of intermediate passages 1608 (specifically, between adjacent cylindrical bores 1618 of the intermediate passages 1608). When the teeth 1642 of the lock clip 1640 are received in the passages 1644 of the base plate 1604, each tooth 1642 engages at least one surface on the neck 1632 of an associated valve 1620, such that an interference fit between the at least one surface of the neck 1632 and tooth 1642 prevents (or at least impedes) rotation of the valve 1620 away from its present position. It is contemplated that any of the valves described in the present disclosure may be provided with similar position locking mechanism.

While certain illustrative embodiments have been described in detail in the figures and the foregoing description, such an illustration and description is to be considered as exemplary and not restrictive in character, it being understood that only illustrative embodiments have been shown and described and that all changes and modifications that come within the spirit of the disclosure are desired to be protected. There exists a plurality of advantages of the present disclosure arising from the various features of the apparatus, systems, and methods described herein. It will be noted that alternative embodiments of the apparatus, systems, and methods of the present disclosure may not include all of the features described, yet still benefit from at least some of the advantages of such features. Those of ordinary skill in the art may readily devise their own implementations of the apparatus, systems, and methods that incorporate one or more of the features of the present disclosure.

The invention claimed is:

1. A coldplate assembly comprising:
a base plate defining an inlet passage, an outlet passage, a first intermediate passage, a second intermediate passage, and a transverse passage, wherein the first and second intermediate passages are each disposed between the inlet passage and the outlet passage, and wherein the transverse passage is arranged to intersect the first intermediate passage to define a first junction and to intersect the second intermediate passage to define a second junction; and
a valve comprising at least one protrusion, the valve being moveable within the transverse passage between at least two of: (i) a first position in which the at least one protrusion is disposed with respect to the first and second junctions to redirect a flow of coolant from the first intermediate passage to the second intermediate passage; (ii) a second position in which the at least one protrusion is disposed with respect to the first junction to direct the flow of coolant past the first junction along the first intermediate passage; and (iii) a third position in which the at least one protrusion is disposed with respect to the first junction to close off at least a section of the first intermediate passage to the flow of coolant.

2. The coldplate assembly of claim 1, wherein the valve is moveable within the transverse passage between each of the first, second, and third positions.

3. The coldplate assembly of claim 1, wherein the valve is a rotating valve that is rotatable within the transverse passage between the first, second, and third positions.

4. The coldplate assembly of claim 1, wherein the at least one protrusion of the valve is disposed with respect to the second junction to direct the flow of coolant past the second junction along the second intermediate passage when the valve is in the second position.

5. The coldplate assembly of claim 1, wherein the at least one protrusion of the valve is disposed with respect to the second junction to close off at least a section of the second intermediate passage to the flow of coolant when the valve is in the third position.

6. The coldplate assembly of claim 1, wherein the valve comprises a first end portion and a second end portion coupled to the first end portion by a connecting rod disposed in one of the inlet passage and the outlet passage, and wherein the at least one protrusion is disposed on the second end portion.

7. The coldplate assembly of claim 1, wherein the transverse passage is a first transverse passage, wherein the valve is a first valve, and wherein the base plate further defines a second transverse passage spaced apart from the first transverse passage, the second transverse passage being arranged to intersect the first intermediate passage to define a third junction and to intersect the second intermediate passage to define a fourth junction, the coldplate assembly further comprising:
a second valve that comprises at least one protrusion, wherein the second valve is movable independently from the first valve, and wherein the second valve is moveable within the second transverse passage between at least two of: (i) a first position in which the at least one protrusion is disposed with respect to the third and fourth junctions to redirect flow of coolant from the first intermediate passage to the second intermediate passage; (ii) a second position in which the at least one protrusion is disposed with respect to the third junction to direct flow of coolant past the third junction along the first intermediate passage; and (iii) a third position in which the at least one protrusion is disposed with respect to the third junction to close off at least a section of the first intermediate passage to the flow of coolant.

8. The coldplate assembly of claim 1, wherein the valve is a first valve, and wherein the base plate further defines a third intermediate passage and a fourth intermediate passage, the transverse passage being arranged to also intersect the third intermediate passage to define a third junction and to intersect the fourth intermediate passage to define a fourth junction, the coldplate assembly further comprising:
a second valve that comprises at least one protrusion, wherein the second valve abuts the first valve when the first and second valves are disposed in the transverse passage, wherein the second valve is movable independently from the first valve, and wherein the second valve is moveable within the transverse passage between at least two of: (i) a first position in which the at least one protrusion is disposed with respect to the third and fourth junctions to redirect flow of coolant from the third intermediate passage to the fourth intermediate passage; (ii) a second position in which the at least one protrusion is disposed with respect to the third junction to direct flow of coolant past the third junction along the third intermediate passage; and (iii) a third position in which the at least one protrusion is disposed with respect to the third junction to close off at least a section of the third intermediate passage to the flow of coolant.

9. The coldplate assembly of claim 1, wherein the inlet passage and the outlet passage extend along opposite sides of the base plate, wherein the first intermediate passage and the second intermediate passage extend parallel to the inlet and outlet passages, and wherein the transverse passage is disposed perpendicular to the inlet, outlet, and intermediate passages.

10. A coldplate assembly comprising:
an extruded base plate defining a plurality of extruded passages, the plurality of extruded passages comprising:
an inlet passage configured to deliver coolant to the extruded base plate,
an outlet passage configured to expel coolant from the extruded base plate, and
at least two intermediate passages positioned between the inlet passage and the outlet passage,
wherein a transverse passage machined in the extruded base plate intersects the inlet passage, the at least two intermediate passages, and the outlet passage to connect and transfer coolant between the inlet passage, the at least two intermediate passages, and the outlet passage; and
a first valve positioned in the transverse passage and movable within the transverse passage between different positions to redirect a coolant through the coldplate assembly,
wherein the first valve is disposed at a first junction where the transverse passage intersects a first intermediate passage of the at least two intermediate passages, wherein the first junction defines a boundary between first and second sections of the transverse passage, and wherein the first valve is movable within the first junction between at least two of: (i) a first position in which a protrusion of the first valve is arranged to redirect a flow of coolant between the first intermediate passage and the first section of the transverse passage, (ii) a second position in which the protrusion of the first valve is arranged to redirect the flow of coolant between the first intermediate passage and the second section of the transverse passage, and (iii) a third position in which the protrusion of the first valve is arranged to allow the flow of coolant between the first and second sections of the transverse passage.

11. The coldplate assembly of claim 10, wherein the transverse passage is a first milled transverse passage, wherein the extruded base plate further includes a second milled transverse passage, wherein each of the first and second milled transverse passages is arranged to intersect the inlet passage, the at least two intermediate passages, and the outlet passage, and wherein the first and second milled transverse passages are disposed about opposite ends of the extruded base plate.

12. The coldplate assembly of claim 11, further comprising:
a second valve disposed in the second milled transverse passage,
wherein each of the first and second valves is movable within the corresponding milled transverse passage between at least two of: (i) a first position in which at least one protrusion of the valve is arranged to redirect a flow of coolant between the at least two intermediate passages, (ii) a second position in which the at least one protrusion is arranged to direct parallel flows of coolant past the valve along the at least two intermediate passages, and (iii) a third position in which the at least one protrusion is arranged to close off at least a section of each of the at least two intermediate passages to the flow of coolant.

13. The coldplate assembly of claim 10, wherein each of the at least two intermediate passages is shaped such that a horizontal cross-sectional dimension of the intermediate passage is greater than a vertical cross-sectional dimension of the intermediate passage.

14. The coldplate assembly of claim 10, wherein the first valve is further configured to allow the flow of coolant between the first intermediate passage and either of the first and second sections of the transverse passage when the first valve is in the third position.

15. The coldplate assembly of claim 10, further comprising:
a second valve disposed at a second junction where the transverse passage intersects a second intermediate passage of the at least two intermediate passages, wherein the second junction defines a boundary between the second section and a third section of the transverse passage, and wherein the second valve is movable within the second junction between at least two of: (i) a first position in which a protrusion of the second valve is arranged to redirect the flow of coolant between the second intermediate passage and the second section of the transverse passage, (ii) a second position in which the protrusion of the second valve is arranged to redirect the flow of coolant between the second intermediate passage and the third section of the transverse passage, and (iii) a third position in which the protrusion of the second valve is arranged to allow the flow of coolant between the second and third sections of the transverse passage.

16. The coldplate assembly of claim 10, further comprising a lock clip configured to engage a surface of the first valve to prevent movement of the first valve between the first, second, and third positions.

* * * * *